United States Patent
Jacobs, II

(10) Patent No.: US 11,599,086 B2
(45) Date of Patent: Mar. 7, 2023

(54) NATURAL LANGUAGE USER INTERFACE FOR COMPUTER-AIDED DESIGN SYSTEMS

(71) Applicant: Desprez, LLC, New London, NH (US)

(72) Inventor: James L. Jacobs, II, Amherst, NH (US)

(73) Assignee: Desprez, LLC, New London, NH (US)

( * ) Notice: Subject to any disclaimer, the term of this patent is extended or adjusted under 35 U.S.C. 154(b) by 0 days.

(21) Appl. No.: 15/861,490

(22) Filed: Jan. 3, 2018

(65) Prior Publication Data

US 2018/0129188 A1    May 10, 2018

Related U.S. Application Data

(63) Continuation-in-part of application No. 15/388,940, filed on Dec. 22, 2016, now Pat. No. 10,229,679,
(Continued)

(51) Int. Cl.
*G10L 15/26* (2006.01)
*G06F 30/00* (2020.01)
(Continued)

(52) U.S. Cl.
CPC ......... *G05B 19/4093* (2013.01); *G06F 30/00* (2020.01); *G06F 40/30* (2020.01);
(Continued)

(58) Field of Classification Search
CPC ......... G10L 15/00; G10L 15/22; G10L 15/26; G10L 15/265; G05B 19/4093;
(Continued)

(56) References Cited

U.S. PATENT DOCUMENTS

| | | | |
|---|---|---|---|
| 4,495,559 A | 1/1985 | Gelatt, Jr. et al. | |
| 5,117,354 A | 5/1992 | Long | |

(Continued)

FOREIGN PATENT DOCUMENTS

| | | |
|---|---|---|
| CN | 2112190 U | 8/1992 |
| WO | 154476 A2 | 8/2001 |

(Continued)

OTHER PUBLICATIONS

Defining Lead Time for APS Planning; http://t3.apptrix.com/syteline/Language/en-US/Other/Process/Defining_Lead_Time.htm [online][retrieved Mar. 31, 2017].

(Continued)

*Primary Examiner* — Paras D Shah
(74) *Attorney, Agent, or Firm* — Caldwell Intellectual Property Law

(57) ABSTRACT

A method for providing a natural language interface for a computer-aided design (CAD) system includes receiving a user voice input comprising a plurality of words, parsing the user voice input, determining a meaning for the parsed user voice input, the meaning including one or more words associated with an object and one or more words associated with a characteristic of the object, retrieving from a model descriptor database at least an object model descriptor and at least a characteristic descriptor, using the determined meaning, generating at least a graphical model of the object using the at least an object model descriptor, and generating at least a modified graphical model of the object, using the at least a characteristic descriptor.

18 Claims, 21 Drawing Sheets

Related U.S. Application Data which is a continuation of application No. 14/486,550, filed on Sep. 15, 2014, now Pat. No. 9,613,020.

(51) Int. Cl.
 *G06F 40/30* (2020.01)
 *G10L 15/00* (2013.01)
 *G05B 19/4093* (2006.01)

(52) U.S. Cl.
 CPC .... *G10L 15/26* (2013.01); *G05B 2219/35453* (2013.01); *G10L 15/00* (2013.01); *Y02P 90/02* (2015.11)

(58) Field of Classification Search
 CPC .......... G05B 19/4099; G05B 19/40931; G05B 19/40932; G05B 19/40933; G05B 19/40935; G05B 19/40936; G05B 19/40938; G05B 19/4097; G05B 2219/13139; G05B 2219/23005; G05B 2219/23007; G05B 2219/23011; G05B 2219/23012
 See application file for complete search history.

(56) References Cited

U.S. PATENT DOCUMENTS

| | | | |
|---|---|---|---|
| 5,465,221 A | 11/1995 | Merat et al. | |
| 5,495,430 A | 2/1996 | Matsunari et al. | |
| 5,552,995 A | 9/1996 | Sebastian | |
| 5,570,291 A | 10/1996 | Dudle et al. | |
| 5,655,087 A | 8/1997 | Hino et al. | |
| 5,758,328 A | 5/1998 | Giovannoli | |
| 5,847,971 A | 12/1998 | Ladner et al. | |
| 5,870,719 A | 2/1999 | Maritzen et al. | |
| 5,937,189 A | 8/1999 | Branson et al. | |
| 6,031,535 A | 2/2000 | Barton | |
| 6,112,133 A | 8/2000 | Fishman | |
| 6,295,513 B1 | 9/2001 | Thackston | |
| 6,341,271 B1 | 1/2002 | Salvo et al. | |
| 6,343,285 B1 | 1/2002 | Tanaka et al. | |
| 6,611,725 B1 | 8/2003 | Harrison | |
| 6,647,373 B1 | 11/2003 | Carlton-Foss | |
| 6,701,200 B1 | 3/2004 | Lukis et al. | |
| 6,750,864 B1 | 6/2004 | Anwar | |
| 6,834,312 B2 | 12/2004 | Edwards et al. | |
| 6,836,699 B2 | 12/2004 | Lukis et al. | |
| 6,859,768 B1 | 2/2005 | Wakelam et al. | |
| 6,922,701 B1 | 6/2005 | Ananian et al. | |
| 6,917,847 B2 | 7/2005 | Littlejohn et al. | |
| 7,006,084 B1 | 2/2006 | Buss et al. | |
| 7,058,465 B2 | 6/2006 | Emori et al. | |
| 7,079,990 B2 | 7/2006 | Haller et al. | |
| 7,085,687 B2 | 8/2006 | Eckenwiler et al. | |
| 7,089,082 B1 | 8/2006 | Lukis et al. | |
| 7,123,986 B2 | 10/2006 | Lukis et al. | |
| 7,134,096 B2 | 11/2006 | Brathwaite et al. | |
| 7,299,101 B2 | 11/2007 | Lukis et al. | |
| 7,305,367 B1 | 12/2007 | Hollis et al. | |
| 7,327,869 B2 | 2/2008 | Boyer | |
| 7,343,212 B1 | 3/2008 | Brearley et al. | |
| 7,359,886 B2 | 4/2008 | Sakurai et al. | |
| 7,366,643 B2 | 4/2008 | Verdura et al. | |
| 7,369,970 B2 | 5/2008 | Shimizu et al. | |
| 7,418,307 B2 | 8/2008 | Katircioglu | |
| 7,467,074 B2 | 12/2008 | Faruque et al. | |
| 7,496,487 B2 | 2/2009 | Wakelam et al. | |
| 7,496,528 B2 | 2/2009 | Lukis et al. | |
| 7,499,871 B1 | 3/2009 | McBrayer et al. | |
| 7,523,411 B2 | 4/2009 | Carlin | |
| 7,526,358 B2 | 4/2009 | Kawano et al. | |
| 7,529,650 B2 | 5/2009 | Wakelam et al. | |
| 7,565,139 B2 | 7/2009 | Neven, Sr. et al. | |
| 7,565,223 B2 | 7/2009 | Moldenhauer et al. | |
| 7,567,849 B1 | 7/2009 | Trammell et al. | |
| 7,568,155 B1 | 7/2009 | Axe et al. | |
| 7,571,166 B1 | 8/2009 | Davies et al. | |
| 7,574,339 B2 | 8/2009 | Lukis et al. | |
| 7,590,466 B2 | 9/2009 | Lukis et al. | |
| 7,590,565 B2 | 9/2009 | Ward et al. | |
| 7,603,191 B2 | 10/2009 | Gross | |
| 7,606,628 B2 | 10/2009 | Azuma | |
| 7,630,783 B2 | 12/2009 | Walls-Manning et al. | |
| 7,656,402 B2 | 2/2010 | Abraham et al. | |
| 7,689,936 B2 | 3/2010 | Rosel | |
| 7,733,339 B2 | 6/2010 | Laning et al. | |
| 7,747,469 B2 | 6/2010 | Hinman | |
| 7,748,622 B2 | 7/2010 | Schon et al. | |
| 7,761,319 B2 | 7/2010 | Gil et al. | |
| 7,822,682 B2 | 10/2010 | Arnold et al. | |
| 7,836,573 B2 | 11/2010 | Lukis et al. | |
| 7,840,443 B2 | 11/2010 | Lukis et al. | |
| 7,908,200 B2 | 3/2011 | Scott et al. | |
| 7,957,830 B2 | 6/2011 | Lukis et al. | |
| 7,979,313 B1 | 7/2011 | Baar | |
| 7,993,140 B2 | 8/2011 | Sakezles | |
| 8,000,987 B2 | 8/2011 | Hickey et al. | |
| 8,024,207 B2 | 9/2011 | Ouimet | |
| 8,140,401 B2 | 3/2012 | Lukis et al. | |
| 8,170,946 B2 | 5/2012 | Blair et al. | |
| 8,175,933 B2 | 5/2012 | Cook, Jr. et al. | |
| 8,180,396 B2 | 5/2012 | Athsani et al. | |
| 8,209,327 B2 | 6/2012 | Danish et al. | |
| 8,239,284 B2 | 8/2012 | Lukis et al. | |
| 8,249,329 B2 | 8/2012 | Silver | |
| 8,271,118 B2 | 9/2012 | Pietsch et al. | |
| 8,275,583 B2 | 9/2012 | Devarajan et al. | |
| 8,295,971 B2 | 10/2012 | Krantz | |
| 8,417,478 B2 | 4/2013 | Gintis et al. | |
| 8,441,502 B2 | 5/2013 | Reghetti et al. | |
| 8,515,820 B2 | 8/2013 | Lopez et al. | |
| 8,554,250 B2 | 10/2013 | Linaker | |
| 8,571,298 B2 | 10/2013 | McQueen et al. | |
| 8,595,171 B2 | 11/2013 | Qu | |
| 8,700,185 B2 | 4/2014 | Yucel et al. | |
| 8,706,607 B2 | 4/2014 | Sheth et al. | |
| 8,768,651 B2 | 7/2014 | Bhaskaran et al. | |
| 8,798,324 B2 | 8/2014 | Conradt | |
| 8,806,398 B2 | 8/2014 | Brathwaite et al. | |
| 8,830,267 B2 | 9/2014 | Brackney | |
| 8,849,636 B2 | 9/2014 | Becker et al. | |
| 8,861,005 B2 | 10/2014 | Grosz | |
| 8,874,413 B2 | 10/2014 | Mulligan et al. | |
| 8,923,650 B2 | 12/2014 | Wexler | |
| 8,977,558 B2 | 3/2015 | Nielsen et al. | |
| 9,037,692 B2 | 5/2015 | Ferris | |
| 9,055,120 B1 | 6/2015 | Firman | |
| 9,106,764 B2 | 8/2015 | Chan et al. | |
| 10,773,466 B1* | 9/2020 | Grimaud | H04L 67/02 |
| 2001/0023418 A1 | 9/2001 | Suzuki et al. | |
| 2001/0047251 A1 | 11/2001 | Kemp | |
| 2002/0065790 A1 | 5/2002 | Oouchi | |
| 2002/0087440 A1 | 7/2002 | Blair et al. | |
| 2002/0099579 A1 | 7/2002 | Stowell et al. | |
| 2002/0107673 A1 | 8/2002 | Haller et al. | |
| 2002/0152133 A1 | 10/2002 | King et al. | |
| 2003/0018490 A1 | 1/2003 | Magers et al. | |
| 2003/0069824 A1 | 4/2003 | Menninger | |
| 2003/0078846 A1 | 4/2003 | Burk et al. | |
| 2003/0139995 A1 | 7/2003 | Farley | |
| 2003/0149500 A1 | 8/2003 | Faruque et al. | |
| 2003/0163212 A1 | 8/2003 | Smith et al. | |
| 2003/0172008 A1 | 9/2003 | Hage et al. | |
| 2003/0212610 A1 | 11/2003 | Duffy et al. | |
| 2003/0220911 A1 | 11/2003 | Tompras | |
| 2004/0008876 A1 | 1/2004 | Lure | |
| 2004/0113945 A1 | 6/2004 | Park et al. | |
| 2004/0195224 A1 | 10/2004 | Kanodia et al. | |
| 2005/0055299 A1 | 3/2005 | Chambers et al. | |
| 2005/0125092 A1 | 6/2005 | Lukis et al. | |
| 2005/0144033 A1 | 6/2005 | Vreeke et al. | |
| 2005/0171790 A1 | 8/2005 | Blackmon | |
| 2005/0251478 A1 | 11/2005 | Yanavi | |
| 2005/0273401 A1 | 12/2005 | Yeh et al. | |

(56) References Cited

U.S. PATENT DOCUMENTS

| | | |
|---|---|---|
| 2006/0085322 A1 | 4/2006 | Crookshanks |
| 2006/0185275 A1 | 8/2006 | Yatt |
| 2006/0253214 A1 | 11/2006 | Gross |
| 2007/0016437 A1 | 1/2007 | Elmufdi et al. |
| 2007/0067146 A1 | 3/2007 | Devarajan et al. |
| 2007/0073593 A1 | 5/2007 | Perry et al. |
| 2007/0112635 A1 | 5/2007 | Loncaric |
| 2007/0198231 A1 | 8/2007 | Walch |
| 2008/0120086 A1 | 5/2008 | Lilley et al. |
| 2008/0183614 A1 | 7/2008 | Gujral et al. |
| 2008/0189091 A1* | 8/2008 | Inoke ................ G06F 30/23 703/7 |
| 2008/0269942 A1 | 10/2008 | Free |
| 2008/0281678 A1 | 11/2008 | Keuls et al. |
| 2009/0058860 A1 | 3/2009 | Fong et al. |
| 2009/0208773 A1 | 8/2009 | DuPont |
| 2009/0299799 A1 | 12/2009 | Racho et al. |
| 2009/0319388 A1 | 12/2009 | Yuan et al. |
| 2011/0040542 A1 | 2/2011 | Sendhoff et al. |
| 2011/0047140 A1 | 2/2011 | Free |
| 2011/0209081 A1 | 8/2011 | Chen et al. |
| 2011/0213757 A1 | 9/2011 | Bhaskaran et al. |
| 2012/0016678 A1 | 1/2012 | Gruber et al. |
| 2012/0072299 A1 | 3/2012 | Sampsell |
| 2012/0109591 A1* | 5/2012 | Thompson ........... G06F 17/50 703/1 |
| 2012/0230548 A1 | 9/2012 | Calman et al. |
| 2012/0316667 A1 | 12/2012 | Hartloff |
| 2013/0055126 A1 | 2/2013 | Jackson |
| 2013/0097259 A1 | 4/2013 | Li |
| 2013/0100128 A1 | 4/2013 | Steedly et al. |
| 2013/0138529 A1 | 5/2013 | Hou |
| 2013/0144566 A1 | 6/2013 | De Biswas |
| 2013/0166470 A1 | 6/2013 | Grala et al. |
| 2013/0218961 A1 | 8/2013 | Ho |
| 2013/0293580 A1 | 11/2013 | Spivack |
| 2013/0297320 A1 | 11/2013 | Buser |
| 2013/0297460 A1 | 11/2013 | Spivack |
| 2013/0311914 A1 | 11/2013 | Daily |
| 2013/0325410 A1 | 12/2013 | Jung et al. |
| 2014/0042136 A1 | 2/2014 | Daniel et al. |
| 2014/0067333 A1 | 3/2014 | Rodney et al. |
| 2014/0075342 A1 | 3/2014 | Corlett |
| 2014/0098094 A1 | 4/2014 | Neumann et al. |
| 2014/0157579 A1 | 6/2014 | Chhabra et al. |
| 2014/0207605 A1 | 7/2014 | Allin et al. |
| 2014/0229316 A1 | 8/2014 | Brandon |
| 2014/0279177 A1 | 9/2014 | Stump |
| 2014/0379119 A1 | 12/2014 | Sciacchitano et al. |
| 2015/0055085 A1 | 2/2015 | Fonte et al. |
| 2015/0066189 A1 | 3/2015 | Mulligan et al. |
| 2015/0127480 A1 | 5/2015 | Herrman et al. |
| 2015/0213154 A1* | 7/2015 | Toebben ............. G06F 17/50 703/1 |
| 2015/0234377 A1 | 8/2015 | Mizikovsky |
| 2016/0314341 A1* | 10/2016 | Maranzana .......... G06F 17/50 |
| 2018/0330042 A1* | 11/2018 | Byers ................. G06F 17/5095 |

FOREIGN PATENT DOCUMENTS

| | | |
|---|---|---|
| WO | 171626 A2 | 9/2001 |
| WO | 2001077781 A2 | 10/2001 |
| WO | 2006086332 A2 | 8/2006 |
| WO | 2007067248 A2 | 6/2007 |
| WO | 2011139630 A1 | 11/2011 |
| WO | 2011140646 | 11/2011 |
| WO | 2013058764 A1 | 4/2013 |
| WO | 2014152396 A2 | 9/2014 |

OTHER PUBLICATIONS

"Quartiles." Mathisfun.com. Web. <https://www.mathsisfun.com/data/quartiles.html>. Archive. <https://web.archive.org/web/20170313183511/https://www.mathsisfun.com/data/quartiles.html> [online] [retrieved Mar. 31, 2017].

Wu et al. Interactive 3D Geometric Modelers with 2D UI, 2002, State University of Campinas, www.dca.fee.unicamp.br, Sao Paulo, Brazil; 2002, 8 pages.

"Upload Your Photos, Print a 3D Model with hypr3D." SolidSmack. http://www.solidsmack.com/cad-design-news/hypr3d-photo-video-3d-print/; last accessed on Oct. 13, 2015.

"123D Catch." Autodesk. http://apps.123dapp.com/catch/ [online] [retrieved Mar. 31, 2017].

Rothganger et al. "3D Object Modeling and Recognition from Photographs and Image Sequences." Toward Category-Level Object Recognition. 2006, pp. 105-126, vol. 4170 of the series Lecture Notes in Computer Science. Springer Berlin Heidelberg.

Dealer Information Systems Corporation. "Parts Inventory." http://dis-corp.com/content/agriculture/inventory/parts-inventory. [online] [retrieved Mar. 31, 2017].

EMachineShop. "Emachineshop Features." http://www.emachineshop.com/machine-shop/Features/page518.html. [online] [retrieved Mar. 31, 2017].

Retrieved from:http://www.solidworks.com/sw/products/3d-cad/manufacturing-cost-estimation-quoting.htm p. 1: Automatic Manufacturing Cost Estimation Overview; Solidworks; 2015.

Retrieved from: http://www.gom.com/fileadmin/user_upload/industries/touch_probe_fixtures_EN.pdf; Application Example: Quality Control, Online Calibration and Validation of Fixtures, Jigs and Gauges. GOM mbH, 2008.

http://citeseerx.ist.psu.edu/viewdoc/download?doi=10.1.1.194.7785&rep=rep1&type=pdf Kim, Jin Baek, and Arie Segev. "A web services-enabled marketplace architecture for negotiation process management." Decision Support Systems 40.1 (2005): 71-87.

Jaiswal, Ashutosh et al., "Design and Implementation of a Secure Multi-Agent Marketplace", Elsevier Science, pp. 1-23, Jun. 3, 2004; http://magnet.cs.umn.edu/papers/Jaiswal04cera.pdf.

http://www.computer.org/csdl/proceedings/hicss/2005/2268/01/22680038.pdf Bui, Tung, and Alexandre Gachet. "Web services for negotiation and bargaining in electronic markets: Design requirements and implementation framework." System Sciences, 2005. HICSS'05. Proceedings of the 38th Annual Hawaii International Conference on. IEEE, 2005.

http://www.bridgelinedigital.com/File%20Library/Repository/eCommerce/Sample-eCommerce-RFP-Template_Bridgeline-Digital.pdf. Sample RFP Template: Ecommerce Platform, Bridgeline Digital, 2014.

Matchbook, Tealbook, http://www.matchbookinc.com/ Sep. 28, 2015.

3Diligent, Source Smarter, http://www.3diligent.com/customer.html; Sep. 28, 2015.

Dassault Systemes, Brochure, Mar. 24, 2010: New Features Type3ToCatia http://www.type3.us/content/download/2202/405535/file/New%20Feature_Type3ToCatia_2010_US%20old.pdf.

Xue, S., X. Y. Kou, and S. T. Tan. "Natural voice-enabled CAD: modeling via natural discourse." Computer-Aided Design and Applications 6.1 (2009): 125-136.

Kou, X. Y., S. K. Xue, and S. T. Tan. "Knowledge-guided inference for voice-enabled CAD." Computer-Aided Design 42.6 (2010): 545-557.

Sharma, Anirudh, et al. "MozArt: a multimodal interface for conceptual 3D modeling." Proceedings of the 13th international conference on multimodal interfaces. ACM, 2011.

Sorpas ("User Manual,", Swanted Software and Engineering Aps, 2011 (120 pages)).

Kalpakjian, S. and Schmid, S., *Manufacturing Processes for Engineering Materials*, 5$^{th}$ Ed. Pearson (Jul. 27, 2007).

Wang and Bourne, Design and Manufacturing of Sheet Metal Parts: Using Features to Aid Process Planning and Resolve Manufacturability Problems, Robotics and Computer-Integrated Manufacturing, vol. 13, No. 3, pp. 281-294 (1997).

U.S. Appl. No. 14/267,447, Aug. 5, 2015, Office Action.
U.S. Appl. No. 14/197,922, Nov. 26, 2014, Office Action.
U.S. Appl. No. 14/197,922, Apr. 27, 2015, Response to Office Action.
U.S. Appl. No. 14/197,922, May 15, 2015, Office Action.

(56) References Cited

OTHER PUBLICATIONS

U.S. Appl. No. 14/267,447, Jun. 18, 2015, Response to Office Action.
U.S. Appl. No. 14/263,665, Oct. 8, 2015, Office Action.
U.S. Appl. No. 14/053,222, Jan. 29, 2016, Office Action, now U.S. Pat. No. 9,606,701.
U.S. Appl. No. 14/311,943, Apr. 27, 2016, Office Action.
U.S. Appl. No. 14/486,550, May 26, 2016, Office Action.
U.S. Appl. No. 14/060,033, Jun. 15, 2016, Office Action.
U.S. Appl. No. 14/172,462, Jul. 6, 2016, Office Action.
U.S. Appl. No. 14/053,222, Jul. 29, 2016, Response to Office Action.
U.S. Appl. No. 14/185,204, Jul. 29, 2016, Office Action.
U.S. Appl. No. 14/062,947, Sep. 16, 2016, Office Action.
U.S. Appl. No. 14/457,758, Sep. 30, 2016, Office Action.
U.S. Appl. No. 14/457,758, Mar. 29, 2017, Response to Office Action.
U.S. Appl. No. 14/195,391, Oct. 18, 2017, Office Action.
U.S. Appl. No. 14/172,404, Oct. 20, 2017, Office Action.
U.S. Appl. No. 14/275,116, Dec. 28, 2016, Office Action.
U.S. Appl. No. 14/303,372, Jan. 11, 2017, Office Action.
U.S. Appl. No. 14/246,254, Jan. 11, 2017, Office Action.
U.S. Appl. No. 14/229,008, Jan. 13, 2017, Office Action.
U.S. Appl. No. 14/060,033, filed Oct. 22, 2013.
U.S. Appl. No. 14/053,222, filed Oct. 14, 2013, now U.S. Pat. No. 9,606,701.
U.S. Appl. No. 14/172,462, filed Oct. 16, 2013.
U.S. Appl. No. 14/062,947, filed Oct. 25, 2013.
U.S. Appl. No. 14/172,404, filed Feb. 4, 2014.
U.S. Appl. No. 14/303,372, filed Jun. 12, 2014.
U.S. Appl. No. 14/185,204, filed Feb. 20, 2014.
U.S. Appl. No. 14/195,391, filed Mar. 3, 2014.
U.S. Appl. No. 14/246,254, filed Apr. 7, 2014.
U.S. Appl. No. 14/229,008, filed Mar. 28, 2014.
U.S. Appl. No. 14/197,922, filed Mar. 5, 2014.
U.S. Appl. No. 14/263,665, filed Apr. 28, 2014.
U.S. Appl. No. 14/267,447, filed May 1, 2014.
U.S. Appl. No. 14/311,943, filed Jun. 23, 2014.

* cited by examiner

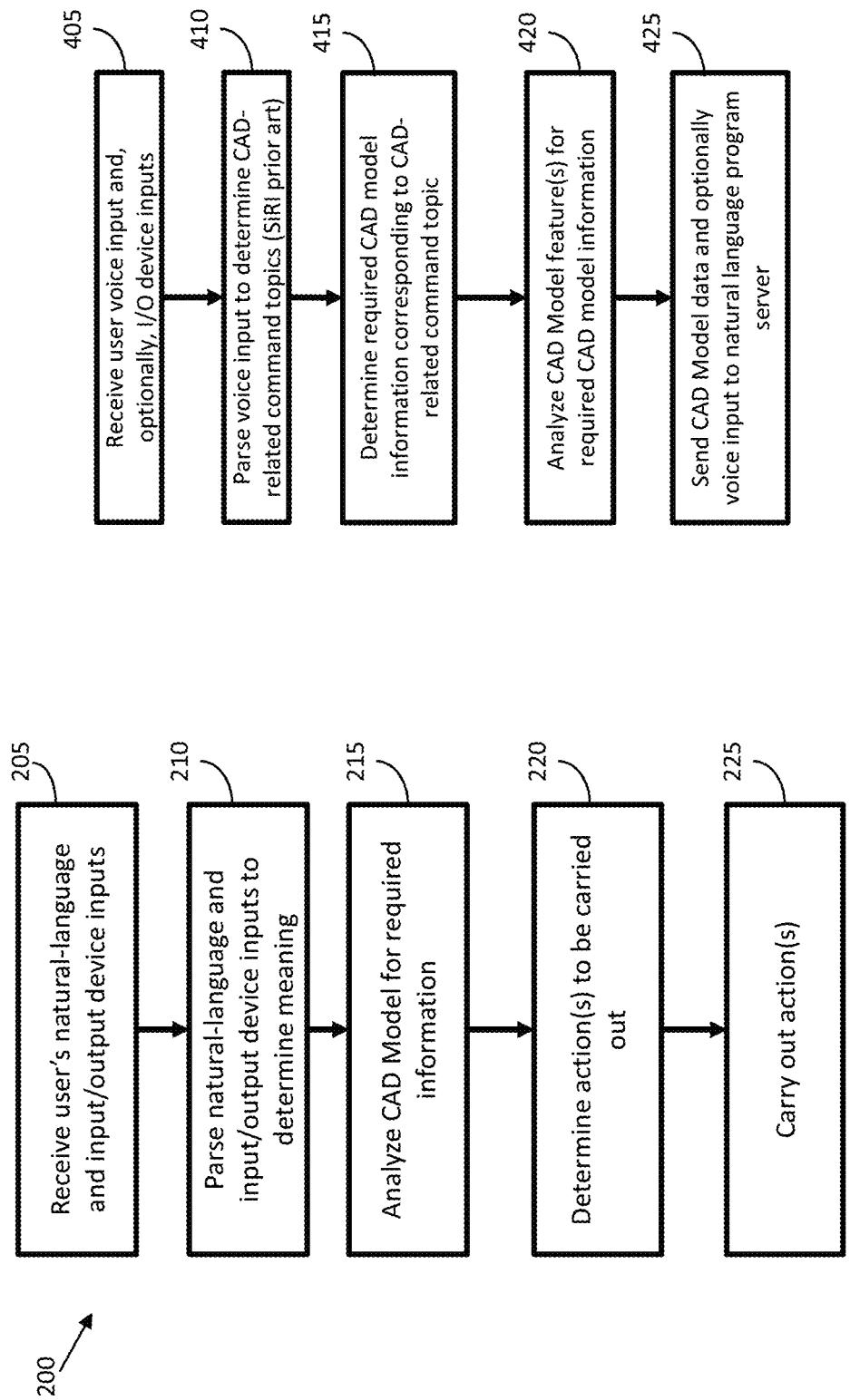

CAD Context Database 500

| Command Topic | Required Information | | | | | | | Search Address | | | |
|---|---|---|---|---|---|---|---|---|---|---|---|
| | Part Material | Min/Max Thickness | Surface Area | Hole Diameters | Overall Part Dimensions (L x W x H) | Flat Boundary Dimensions | Formula based calc? | McMaster Carr | PEM | Metal Depot | etc... |
| Screw | Yes | Yes | X | Yes | X | X | Yes | X | Yes | X | ... |
| Bolt | Yes | Yes | X | Yes | X | X | Yes | Yes | X | X | ... |
| Nut | Yes | X | X | Yes | X | X | X | Yes | Yes | X | ... |
| Sheet Metal | Yes | Yes | Yes | X | Yes | Yes | X | X | X | Yes | ... |
| Rip | X | Yes | X | X | X | Yes | Yes | X | X | X | ... |
| Bend | Yes | Yes | X | X | X | Yes | Yes | X | X | X | ... |
| Rivet | Yes | Yes | X | Yes | X | X | Yes | X | X | X | ... |
| Seam Weld | Yes | Yes | X | X | X | X | Yes | X | X | X | ... |
| etc... | ... | ... | ... | ... | ... | ... | ... | ... | ... | ... | ... |

| Object Model Descriptor 800 | | Descriptive Word 816 |
|---|---|---|
| | | Descriptive Word 816 |
| Mathematical Description 804 | Parametric Instruction 808 | Descriptive Word 816 |
| | | Descriptive Word 816 |
| Object Model Descriptor 800 | | Descriptive Word 816 |
| | | Descriptive Word 816 |
| Mathematical Description 804 | Parametric Instruction 808 | Descriptive Word 816 |
| | | Descriptive Word 816 |
| Characteristic Descriptor 812 | | Descriptive Word 816 |
| | | Descriptive Word 816 |
| | | Descriptive Word 816 |
| | | Descriptive Word 816 |

| Object Model Descriptor 800 | Projection 1400 |
| --- | --- |
| | Projection 1400 |
| | Projection 1400 |
| | Projection 1400 |
| Object Model Descriptor 800 | Projection 1400 |
| | Projection 1400 |
| | Projection 1400 |
| | Projection 1400 |
| * * * | |

FIG. 14

NATURAL LANGUAGE USER INTERFACE FOR COMPUTER-AIDED DESIGN SYSTEMS

RELATED APPLICATION DATA

This application is a continuation-in-part of U.S. patent application Ser. No. 15/388,940, filed on Dec. 22, 2016, which is a continuation of U.S. patent application Ser. No. 14/486,550, filed on Sep. 15, 2014, and entitled "Natural Language User Interfaces For Computer-Aided Design Systems," which is patented with U.S. Pat. No. 9,613,020 B1 issued on Apr. 4, 2017. Each of U.S. patent application Ser. No. 15/388,940, U.S. patent application Ser. No. 14/486,550, and U.S. Pat. No. 9,613,020 B1 is incorporated by reference herein in its entirety.

FIELD OF THE INVENTION

The present invention generally relates to the field of computer-aided design. In particular, the present invention is directed to natural language user interfaces for computer-aided design systems.

BACKGROUND

Computer-aided design (CAD) programs allow designers to create computer models of products to be manufactured. Such programs can be incredibly complex and take extensive training and use before a designer becomes efficient in the use of the program. Natural language interfaces have been proposed as a means for simplifying many different human-machine interactions. While such programs are having increasing success in terms of adoption for general use, for example, the ability to ask simple questions like weather or direction queries of a mobile phone interface (see, e.g., US Pub. No. 2012/0016678, entitled "Intelligent Automated Assistant," which is incorporated by reference herein in its entirety), such systems still do not provide an adequate or user-friendly interface for many complex systems, such as CAD programs, that employ specialized language and wherein context-specific terminology has multiple meanings and/or multiple defining parameters that vary with the context.

While attempts have been made at providing natural language interfaces for CAD systems (see, e.g., US Pub. No. 2009/0058860, entitled "Method For Transforming Language Into A Visual Form," which is incorporated by reference herein in its entirety), such systems in themselves have been overly complex and have not produced results that have led to general application and use.

SUMMARY OF THE DISCLOSURE

In an implementation, the present disclosure is directed to a method for providing a natural language interface for a computer-aided design (CAD) system. The method includes automatedly receiving, via the computing device, a user voice input including a plurality of words. The method includes automatedly, via the computing device, parsing the user voice input. The method includes automatedly, via the computing device, determining a meaning for the parsed user voice input, the meaning including one or more words associated with an object and one or more words associated with a characteristic of the object. The method includes automatedly, via the computing device, retrieving from a model descriptor database at least an object model descriptor and at least a characteristic descriptor, using the determined meaning. The object model descriptor includes at least a mathematical description of a three-dimensional object form of the object and at least a first parametric instruction for manufacturing the object using the three-dimensional object form. The method includes automatedly, via the computing device, generating at least a graphical model of the object using the at least an object model descriptor. The method includes automatedly, via the computing device, generating at least a modified graphical model of the object, using the at least a characteristic descriptor.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 2 is a flow diagram illustrating a high level method according to an embodiment of the present invention;

FIG. 4 is a flow diagram illustrating a sub-step within the embodiments shown in FIG. 2 or 3;

FIG. 5 schematically represents a partial example of information contained within a context database according to an embodiment of the present invention;

FIGS. 7A and 7B are block diagrams schematically illustrating another exemplary embodiment of query generating algorithm, wherein FIG. 7A represents an exemplary parsing algorithm and FIG. 7B represents an exemplary query algorithm;

FIG. 8 represents an exemplary model descriptor database in an embodiment;

FIG. 14 represents an exemplary reverse projection database as described herein in an embodiment;

DETAILED DESCRIPTION

Figure 1A:
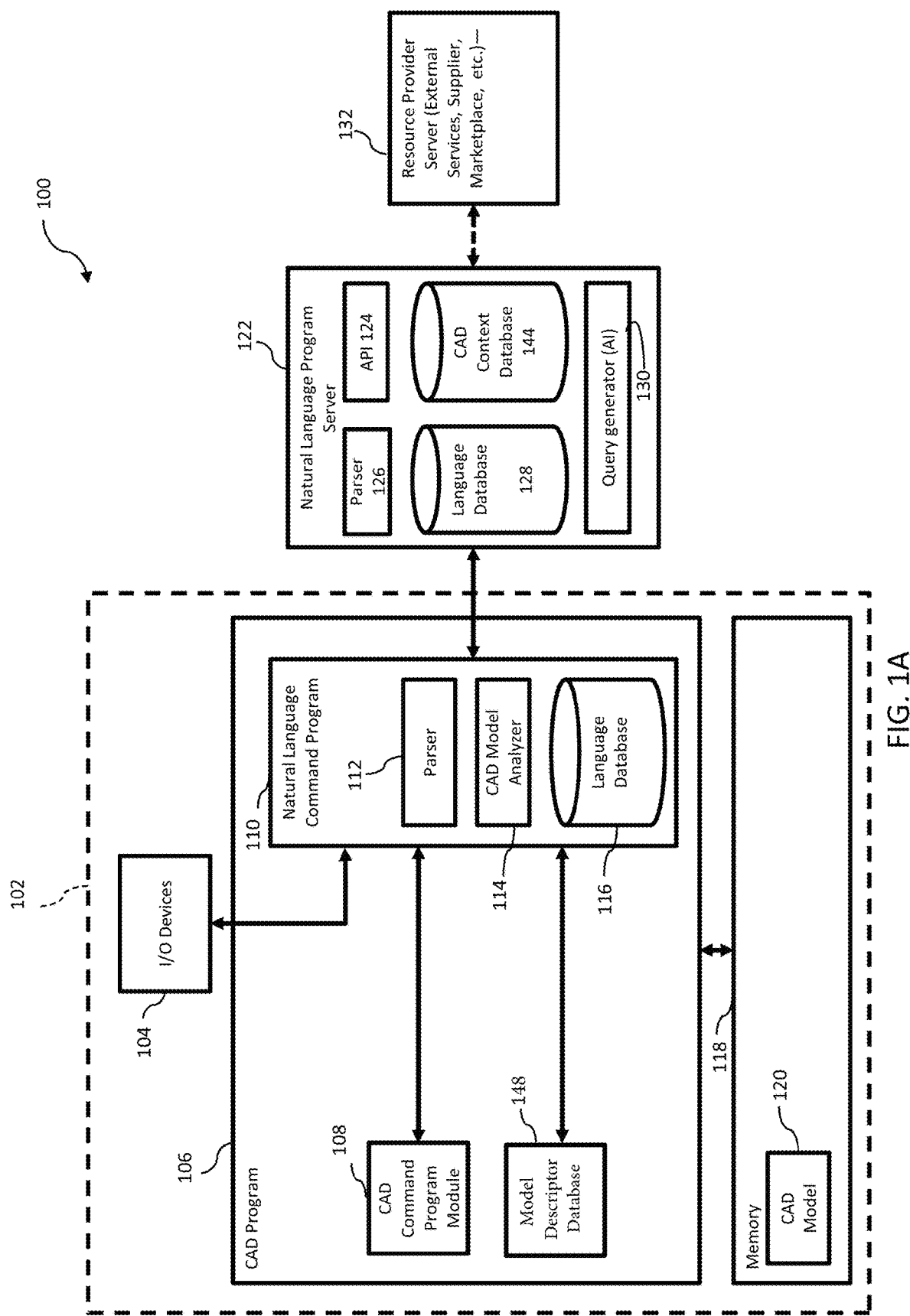
FIG. 1A is a block diagram schematically illustrating a system according to one embodiment of the present invention.

Aspects of the present invention include techniques, methods, hardware and software for providing natural language interfaces in and for computer-aided design (CAD) systems. Exemplary embodiments are described herein below and illustrated in the accompanying drawings. It will be understood by those skilled in the art that various changes, omissions and additions may be made to that which is specifically disclosed herein without departing from the spirit and scope of the present invention.

As used herein, a structure may be an object or part having a particular geometry, and a computer model may be a virtual representation of a structure and may be created using an appropriate CAD system or program. A designer may be the designer of a computer model, a purchaser, an agent of the purchaser, and a consumer, a home user, or a customer, among others. Examples of a structure include a piece of sheet metal, a solid cube, a cylindrical pipe, an injection molded plastic toy, an article of clothing such as a shirt made of cotton, and an assembly of various parts such as a vehicle, among others. A project (or design) may refer to a CAD model of a part or an assembly of CAD models of parts that may be a virtual representation of a particular structure and may be created using one or more appropriate CAD systems or programs.

One or more aspects of the present invention can be implemented in any of a wide variety of manners, such as within a single computing device or by two or more networked computing devices, among others. In some embodiments, functionalities of systems described herein may be integrated into computer modeling programs directly via add-on software.

As would be apparent to one reasonably skilled in the art, aspects and embodiments of the invention may be applied to any number of manufacturing types, including but not limited to the manufacture of apparel and sheet metal products among others. In the case of sheet metal and apparel, designers use CAD systems to design their products, using sheets of flat material for manufacture. Design data, such as material choice, precise dimensions, or locations of additional features may be embedded within the digital design. Designers may choose different metals or fabrics (including non-woven materials such as leather) depending on the strength and other inherent properties of the material, which affects what manufacturing methods may be necessary to work the material. Purchased components (in some cases, identical purchased components) may be added to the design. CAD programs may be used to visualize the shape of the finished product. In both sheet metal and apparel manufacturing the sheet (metal or fabric) may be cut or stamped by a variety of methods using computerized machines. Units are moved from station to station during manufacture. Where sheet metal is connected by rivets or welding, sheet fabric is connected by stitching or gluing. Surface finishes may be applied to both; both may be painted, silk-screened, or otherwise covered with a protective substance. While sheet metal and fabric apparel products have commonalities as discussed above, it will be appreciated by those skilled in the art that other design and manufacturing types which may or may not share many of the same attributes are also amenable to application of embodiments of the present invention.

Referring first to FIG. 1A, an exemplary embodiment of a system 100 in accordance with the teaching of the present invention is described. In one implementation, system 100 comprises one or more computing devices with appropriately networked and/or communicating modules. For example, sub-system 102 may comprise a computer, other computing device or other system as may be devised by a person of ordinary skill for executing functionalities as described herein based on appropriately coded instructions. I/O devices 104 include language-based I/O devices such as a microphone and speakers, as well as other I/O devices such as mouse, keyboard, touch pad or touch screen. CAD program 106 and memory 118 are also included in sub-system 102. CAD program 106 includes, in addition to conventional CAD system functionality, natural language command program 110. Natural language command program 110 comprises parser 112, CAD model analyzer 114 and language database 116. CAD model 120 typically resides in a memory device, such as memory 118 although the memory need not be configured as a part of the system per se, but may be functionally remote and communicate with the system through an appropriate network.

CAD model analyzer 114 functions as a form of interrogator that interrogates the CAD model to return CAD model data as called for by various program functions. In some embodiments, other system modules may include and/or maintain such an interrogator for interrogating information from a CAD model. Additionally or alternatively, natural language program sever module 122, and/or resource provider server module 132 may contain such an interrogator, for example, as a portion of or add-on to a CAD program. CAD model analyzer 114 may analyze a CAD model and output data that may be received and used by natural language command program module 110 or other system modules. Illustrative embodiments for such an analyzer/interrogator may be found in U.S. patent application Ser. No. 14/060,033, filed on Oct. 22, 2013, and titled "AUTOMATED FABRICATION PRICE QUOTING AND FABRICATION ORDERING FOR COMPUTER-MODELED STRUCTURES", which is incorporated by reference herein for its teachings of extracting data from computer models, U.S. patent application Ser. No. 14/282,773, filed on May 20, 2014, and titled "METHODS AND SOFTWARE FOR ENABLING CUSTOM PRICING IN AN ELECTRONIC COMMERCE SYSTEM", which is incorporated by reference herein for its teachings of particular interrogator engines, U.S. patent application Ser. No. 15/467,079, filed on Mar. 23, 2017, and entitled "ELECTRONIC PRICING MACHINE CONFIGURED TO GENERATE PRICES BASED ON SUPPLIER WILLINGNESS AND A USER INTERFACE THEREFOR," which is incorporated by reference herein for its teachings of particular interrogation engines, extraction of information from interrogation engines, analysis of geometry in design files by interrogation engines, extraction of pricing data from computer models, and for generation of pricing for manufactured materials, U.S. Patent Application Ser. No. 62/072,653, filed on Oct. 30, 2014, and titled "METHODS AND SOFTWARE FOR FACILITATING PRICING AND ORDERING OF A STRUCTURE REPRESENTED IN A COMPUTER MODEL," which is incorporated by reference herein for its teachings of various interrogation engines and related functionality and for generation of pricing for manufactured materials. In response to a user input, such as selection of a user interface element, the CAD model data is interrogated to determine and store in memory supply or structure parameters, to compare to parameters of a possible supplier to determine whether or not the possible supplier is capable of and/or willing to supply one or more physical instantiations of the structure. For example, such supply parameters may comprise a list of objective requirements for fabricating a structure associated with the RFP and may be generated using fabrication data associated with the RFP. Such objective requirements may specify baseline capabilities that suppliers must possess in order to be able to successfully fabricate the structure and may include, for example, a maximum dimension of the structure, a material required for the structure, finishing needs, required tolerances, extrapolated machine type(s), and/or a quantity of parts and/or structures, among others, as further described herein. The objective requirements may be generated by analyzing the fabrication data associated with the RFP to determine such information (maximum dimensions, materials, finishing needs, required tolerances, machine type(s), quantity, etc.). In an embodiment the CAD model may be constantly interrogated (running in the background) to establish a list of suppliers before an RFP is received and then when a RFP is received, having a narrowed supplier list to query for a cost. Alternatively, or additionally, a user may input parameters. For example, a user may input a quantity.

CAD program module 106 may comprise any of the modules in a conventional CAD system or program that govern one or more functions of the CAD program as would be understood by persons of ordinary skill in the art. Examples of other CAD system models, not shown, may include: create new item module, select material module, bend module, weld module or cut module. However, natural language command program module 110 is in addition to the conventional modules of the CAD system or program.

Parser 112 parses content of spoken commands received through I/O devices 104 and communicates with language database 116 to determine relevant portions of the spoken command for formulating a query as discussed in more detail below. CAD model analyzer 114, like interrogator, searches for specific information in CAD model 120 and communicates with natural language server module 122.

Natural language program server module, which may be remotely located, may comprise a high capacity server/database to assist in parsing any natural language commands that cannot be parsed through resident module 110. Thus, natural language program server module 122 includes parser 126, which is similar in function to parser 112 but more powerful, and API 124, which would be used to translate commands into required syntax for other system modules, for example, to communicate with resource provider server module 132. Language database 128 is a larger, more powerful version of database 116, and may comprise multiple specialized, plurally accessible library-type databases. Query generator 130 may comprise the artificial intelligence for query generation as described herein below (see, for example, FIGS. 6, 7A and 7B) and thus may comprise a processor and memory of its own, as well as other associated hardware and software suited for its query generation function. CAD context database 144 contains CAD specific information as shown in FIG. 5 and described in more detail below.

Resource provider server module 132 provides external services and/or information when called for by module 122. For example, when information needed to respond to a query resides outside of the CAD system and natural language program server module 122, automated searching of appropriate databases is initiated, the databases being supplied as resource provider server modules 132 in order to provide information from suppliers, marketplaces, and other external services. In some examples, resource provider server module 132 is an external service supplier marketplace database, either a source of information or standalone entity that will perform calculations.

In operation a natural language command plus any additional information concomitantly entered is received through I/O devices 104 and directed to natural language command program module 110, which then parses the command, breaking it into pieces and identifying, using language database 116, the meaning of the command. Information that is identified as being contained within CAD model 120 is analyzed and retrieved by CAD model analyzer 114 by interrogating the CAD model. If for some reason natural language command program module 110 is unable to determine the meaning of a command, it will send an audio file to natural language program server module 122 to be further parsed by parser 126, accessing language database(s) 128. Also at this point, CAD context database 144 communicates with parser 126 to determine what information must be pulled from CAD model 120. Pulled information is sent back through CAD model analyzer 114 to server module 122 and query generator 130 generates a query based on retrieved information.

CAD context database 144 supplements language databases 116 and 128 with CAD specific contextual information that is accessed, for example, when parser 126 is unable to parse a command by access to the more general language databases or if more than one contextual meaning is identified. For example, CAD context database 144 contains information necessary to identify a bolt as a purchase part that is associated with a nut, to separate it from other general language context meanings (i.e., to leave quickly or a lightning bolt). CAD context database 144 also contains information to direct natural language server program module 122 to query resource provider modules 132 when supplier-type or other externally provided information is needed for query completion.

If the query can be executed by the CAD program without further information or data inputs, then the command is translated to the CAD program through natural language command program module 110. However, when the query requires additional, non-resident information, the query is then translated by API 124 and sent to resource provider server module 132 for answer. When the response is returned from resource provider server module 132, API 124 translates the response into a format that can be used by the CAD program module and it is sent back through natural language command program module 110, which delivers an output, such as an auditory output, through I/O devices 104 and/or instructs the CAD command program module 108 to execute the command.

Figure 1B:
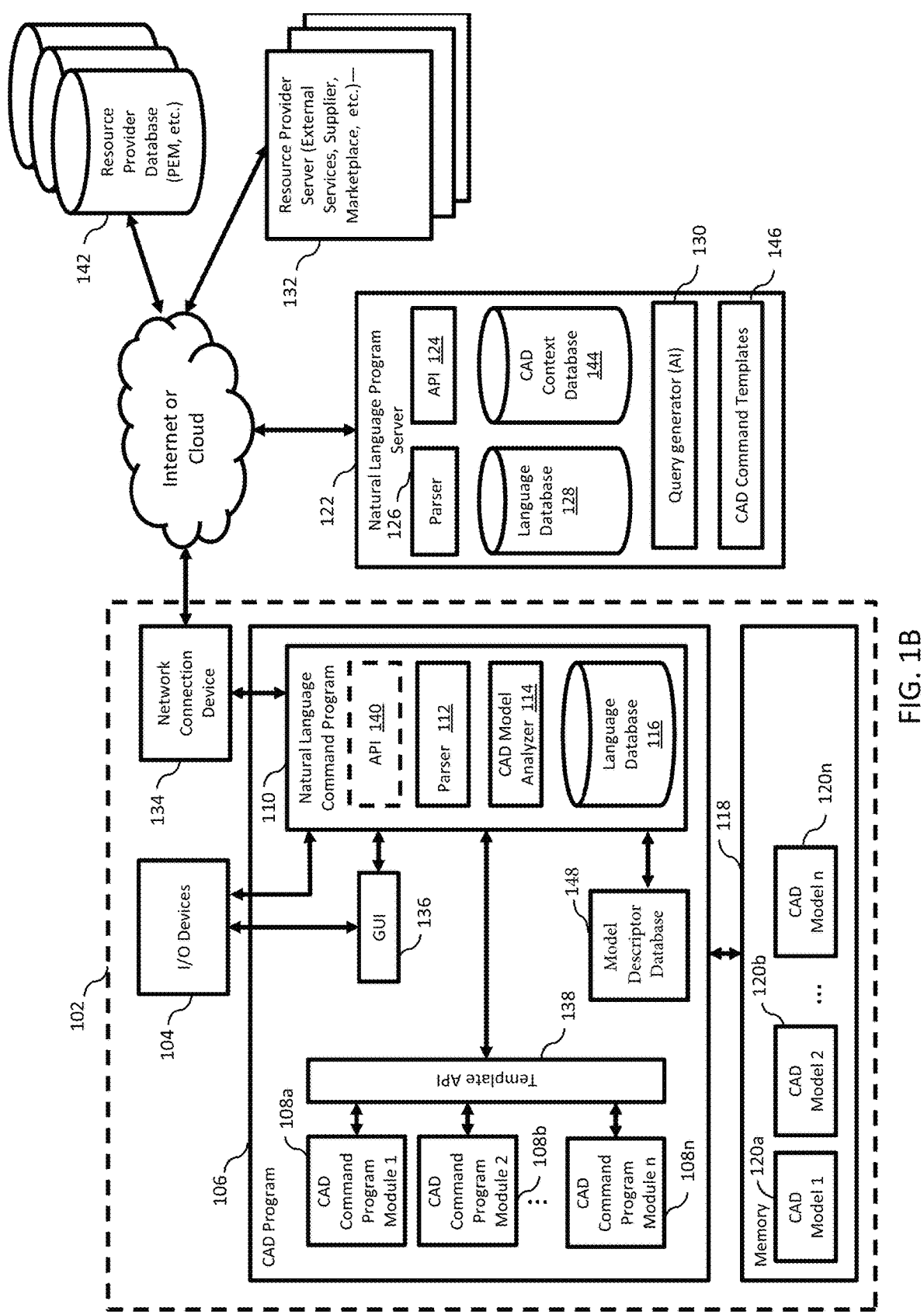
FIG. 1B is a block diagram schematically illustrating an alternative system according to another embodiment of the present invention.

With reference to FIG. 1B, a further alternative system is described. As will be seen, the basic components of FIG. 1A are carried over to the embodiment of FIG. 1B. Added components include network connection device 134 that permits communication with a network, the Internet or information stored in a cloud. Communication through this path may be with natural language program server module 122 as previously described, as well as multiple resource provider server modules 132 and direction with resource provider databases 142.

In this embodiment, CAD program 106 also includes plural CAD program modules 108*a*, *b* . . . *n* communicating with natural language command program module 110 through template API 138. Template API 138 is used to translate commands and other information coming back from the natural language command program module 110 into a command that can be used by the particular CAD program. GUI 136 is also added, optionally communicating between I/O devices 104 and natural language command program module 110 to facilitate interaction with the user. Optional API 140 inside natural language command program module 110 translates and facilitates communications between the various sub-modules.

Within natural language program server module 122, CAD command templates 146 are used in conjunction with template API 138 to send instructions in the language that the CAD program will understand. Thus, CAD model 120*a*, *b*, . . . *n* is to be changed using a command program module. Template API 138 translates a command in a template form to a command that is actually understood by the module.

The following prophetic examples further illustrate operation of embodiments of the system thus described. As is typical in natural language interfaces, the "system" is assigned a name to be spoken by the user to initiation language recognition and parsing, and to distinguish commands from other spoken words. Any suitable name may be assigned. In this case, for illustration purposes only, the assigned name is "Nalcop," representing natural language command program module 110.

Example 1—In operation, a user clicks a hole and says, "Nalcop, I need bolts to fit this hole." Nalcop parses the command with parser 112 and determines that "this hole" refers to a highlighted feature in the displayed CAD model. Natural language command program module 110 then uses CAD model analyzer 114 to gather all data related to the hole from CAD model 120. Then, it sends the data plus message to natural language command program server module 122, where the natural language statement and CAD model data is further parsed (if necessary). Query generator 130 creates a search command using the parsed statement and the CAD model data, and searches resource provider server modules 132 or databases 142 for bolts of the correct diameter and correct length that are compatible with the material in which the hole is located. That data is returned to natural language command program module 110, which displays it in GUI 136.

Example 2—In operation, a user says, "Nalcop, this shelf needs to hold 40 pounds." Natural language command program module 110 cannot initially parse this command, so it sends a voice record to natural language program server module 122. Server module 122 parses the statement and determines that the user's statement is a request to calculate whether the structure can hold 40 pounds. Based on this determination, made using parser 126, language database 128 and CAD context database 144, server module 122 sends natural language command program module 110 instructions to analyze the entire CAD model (to get material, thickness, and angles) and to ask the user which way is up (e.g. necessary to know directionality to perform the analysis) and what factor of safety the user would like to use (e.g., necessary to know how sure the user wants to be that the shelf will hold 40 pounds). Natural language command program module 110 thus poses the required questions through GUI 136 and/or I/O devices 104 and waits for a response from the user. Required CAD model data is accessed by CAD model analyzer 114, combined with user inputs in response to stated questions and transmitted to server module 122. API 124 puts the information in the correct format and sends the data to a resource provider server module 132 which can perform a stress (statics) analysis on a model of that shape using that material. If the analysis determines that the aluminum brackets supporting the shelf will not support the weight, server module 122 sends a "no" answer to natural language command program module 110, which communicates the answer to the user through GUI 136 and/or I/O devices 104. Such communication may take the form of a statement delivered through system speakers. The user may choose to respond to the "no" answer with a further question, such as "Well Nalcop, what will work?" In such a case, that question is parsed to be a request for design modifications. Server module 122 sends common fabrication material options to resource provider server modules 132 to determine whether using a different material in the bracket will work. For purposes of this example, assume stainless steel would be sufficient to hold the weight. In this case, server module 122 may also send different bracket thicknesses, but using the original material (aluminum), to resource provider server modules 132. Assume it is determined that doubling the thickness in the original material will also work. Server module 122 then sends natural language command program module 110 information that the CAD model as it exists will not hold 40 pounds, but stainless steel or double-thickness aluminum will. Natural language command program module 110 then prompts the user through I/O devices 104 and or GUI 136 to indicate whether he wants to use stainless steel or double the thickness of aluminum. The user selection is sent back to server module 122, which fills out a CAD Command Template 146, which is sent back through natural language command program module 110 to template API 138, which instructs CAD program module(s) 108*a*, *b* . . . *n* to make the change.

Continuing to refer to FIGS. 1A-B, system 100 may include a model descriptor database 148. Model descriptor database 148 may contain object model descriptors, as depicted and described in further detail below. Object model descriptors may include any units of data from which system 100 may reconstruct a graphical model of an object, such as an object that may be modeled in a CAD model such as CAD model 120. Model descriptor database 148 may contain one or more characteristic descriptors, each characteristic descriptor of which may describe a way in which a graphical model of an object may be modified to generate a new graphical model of an object, as described in further detail below. Model descriptor database 148 may include one or more words associated with object model descriptors and/or characteristic descriptors. System 100 may add records to model descriptor database by creating new object model descriptors, which may be accomplished, among other things, by generating new geometries or mathematical descriptions of graphical models of objects, by combining existing object model descriptors with other existing object model descriptors, by combining object model descriptors with characteristics to modify the object model descriptors, or by any combination thereof, as described in further detail below. System may also retrieve records from model descriptor database and convert retrieved records into graphical models in response to queries describing features of a desired graphical model or of an object modeled therein, or to match other graphical models or images, as described in further detail below.

With continued reference to FIGS. 1A-B, model descriptor database 148 may be in communication with natural language command program 110; for instance, queries to submit to model descriptor database may be generated by natural language command program 110 and submitted model descriptor database 148. Model descriptor database 148 may also be in communication with any other module or element of system 100 as described above, including without limitation CAD program module 106 and/or CAD program modules 108*a-n*.

Figure 3:
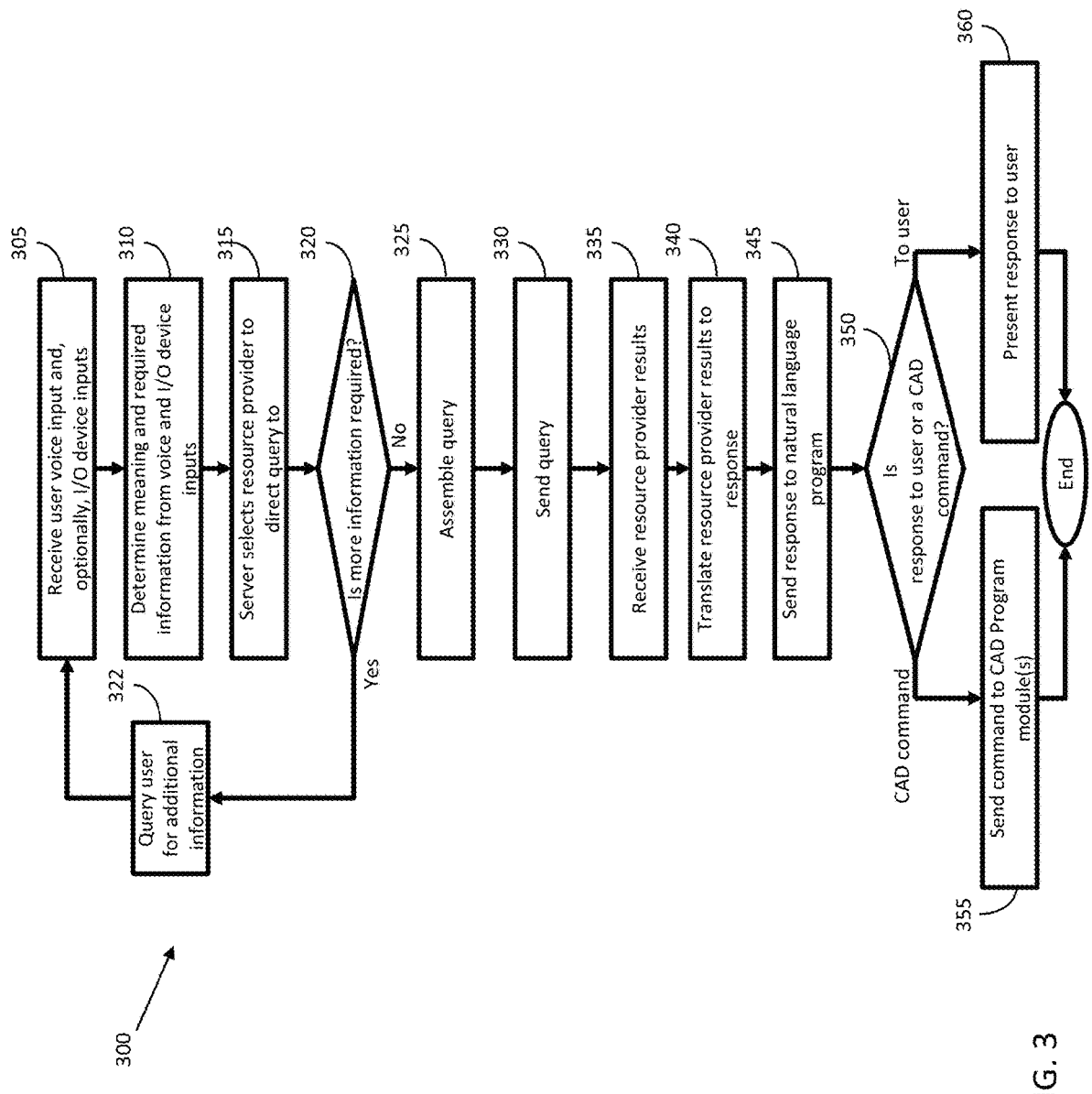
FIG. 3 is a flow diagram illustrating another embodiment of a method according to the present invention with more detail.

Operation of embodiments of the present invention may be further understood with references to the flow diagrams in FIGS. 2, 3 and 4. FIG. 2 illustrates a high-level method comprising five general steps. Step 205 comprises receiving user natural language and input/output device inputs, in other words the user speaks and may also use keyboard or mouse to highlight. For example, a user may say "I need a bolt to fit this hole" while using the mouse to identify the hole and natural language command program module 110 will appropriately associate the two different types of inputs based on context and proximity in time. For example, the context of the parse can include recognition of keyboard/mouse commands such as "make this <highlighted with mouse>, aluminum." In a further alternative, distinct commands may be assigned to correspond to the mouse or keyboard commands so that context is not required, for example, predetermining that spoken "this" plus an immediate physical I/O action go together.

Step 210 comprises parsing the natural language inputs to determine meaning and required information. Step 215 comprises analyzing CAD model 120 for required information, typically using CAD model analyzer 114. Step 220 comprises determining actions to be carried out, for example determining results using resource provider server modules or databases as described above. Step 225 comprises carrying out the action or actions or delivering results to the user.

More detailed method steps are described in connection with the embodiment shown in FIG. 3. In this embodiment, a first step 305 comprises receiving a user voice input and optionally input/output device input as described. In step 310 the meaning of voice and I/O device inputs is determined. More detail on this step is provided in the discussion of FIG. 4 below. Next, at step 315, server module 122 selects a resource provider server module 132 to which the query is to be directed.

Step 320 requires a determination of whether more information is required. If YES, step 322 generates a query to the user to provide additional information and program flow returns to step 305 upon information receipt. If NO, program flow continues on to step 325. In step 325 the query is assembled and then sent in step 330. In step 335 resource provider results are received from either or both of the resource provider server module or databases. Step 340 comprises translating the resource provider results to a response in a form useable by the CAD system. In step 345, the translated response is sent to the natural language command program module.

Step 350 requires another determination, in this case whether the returned response is a CAD command or a response to be directed to the user. In other words, is the response something that is intended to seek feedback or find answer from the user, or is it really a CAD command that should be going into the CAD program for execution? If a CAD command, it is routed at 355 for execution by a CAD program module; if a user response, it is routed at 360 to an appropriate I/O device for communication with the user.

Turning now to FIG. 4, more detail of the command meaning determination in step 310 above is provided. The process in this embodiment begins at step 405 with receiving user voice input and optionally I/O device input, in this case the same as step 305. Next, in step 410, the voice input is parsed to determine the meaning as is generally understood by persons skilled in the art of natural language program interfaces. In step 415, required CAD model information corresponding to as determined CAD-related command topics is further determined. In step 420, CAD model features are analyzed (for example, by CAD model analyzer 114) for required CAD model information. Thereafter, in step 425, CAD model data and optionally voice input are sent to the natural language program server module for further action as elsewhere described herein.

FIG. 5 illustrates exemplary contents of CAD context database 500 in an abbreviated form suitable for representation within the drawings of a patent application. As will be appreciated by persons of ordinary skill, the contents of a CAD context database as described herein will in practice be substantially more voluminous. In the examples illustrated in the figures provided herewith, CAD context database 500 is located within natural language program server module 122. However, it may be otherwise located without departing from the scope of the invention.

As illustrated in the example of FIG. 5, CAD context database 500 comprises a series of command topics in a first column and at least two super-columns thereafter that identify required information and corresponding search addresses or locations for information corresponding to each command topic. In this example, a "Yes" entry in any column indicates applicable or required information, and an "X" entry indicates that information is not required or not applicable. The required information super-column indicates each specific type of information that CAD analyzer 114 must pull from CAD model 120 to respond to a command related to the indicated topic or which must be obtained from a resource provider or other third party source. The search address super-column indicates applicable sources associated with each topic from which the required information may be potentially obtained. In this example, for illustration purposes, the search address columns have been populated with a number of well-known industrial suppliers—McMaster Carr, PEM and Metal Depot—but any source of information appropriate for the particular structures to be made may be populated in the search address columns. Also, when formula-based calculations are required, as explained in further detail below, the source of the formula may be a memory location or calculation engine located within the system or internally networked, in addition to third party or cloud sources.

Figure 6:
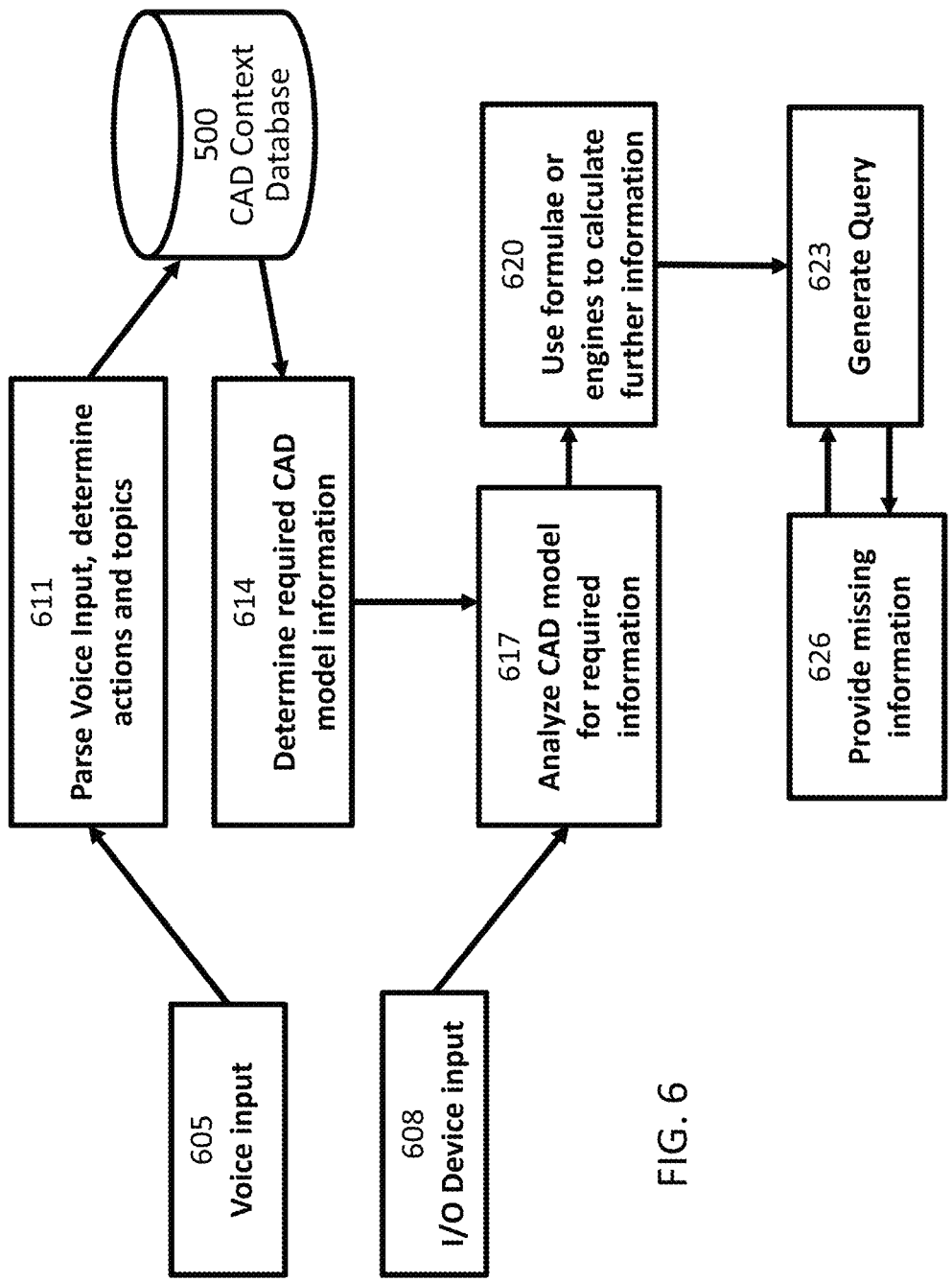
FIG. 6 is a flow diagram illustrating one possible embodiment of a query generation algorithm according to the present invention.

The information thus provided by CAD context database 500 is used to generate search queries, for example as shown in FIG. 6. The flow diagram of FIG. 6 illustrates one possible algorithm for query determination according to embodiments of the present invention, which will be illustrated by two examples with reference to FIG. 6 and Table 1 below. In step 605, a voice input is provided, such as "Nalcop, can you find a bolt to fit the selected hole?" Simultaneously or at a time in close proximity to the voice input, a device input is also provided in step 608. This device input may, in this example, be mouse clicking on a hole in the displayed structure from the CAD model. Next, at step 611 the voice input is parsed to determine actions, topics and required information. In this example, bolt as a topic returns needed information such as diameter, length, and material. This information is returned from CAD context database 500 as described above.

Based on information returned from CAD context database 500, at step 614, a determination is made as to the required CAD model information. In this example, required CAD information includes hole diameter, the material, and thickness of material at the hole location. With this information, at step 617, the CAD model is analyzed to extract the required information. In this example, extracted information may be diameter=0.5 in, thickness=1.5 in to 2.0 in, and material=aluminum. Once required information is returned, at step 620, formulae or engines are accessed and applied as needed to calculate further required information. In this example, max bolt diameter might be calculated at 0.95 in and minimum bolt length at 1.1 in.

With all necessary information in hand, a query is generated at step 623. A hypothetical query for this example may include the following fields and corresponding information: Address: McMaster Carr catalog; Action: search—Term 1: "bolt"—Term 2: "diameter=0.950 in"—Term 3: "length>1.65 in to 2.2 in"—Term 4: "material=aluminum". To the extent any information is determined to be missing, it is provided at step 626. For example, the length of fitting parts could be much longer than thickness of material, leading to many possible fitting results, in which case the natural language command program module will ask the user "What length part do you want?"

Table 1 below shows how the initial search request— "Nalcop, can you find a bolt to fit the selected hole?"—is parsed and the associated program actions and other associated events that flow from the request.

independent of the part being analyzed, leading to many possible choices. NLCP Module 110 asks, "Is there a specific length stud you want?" This information is then added to the query as Term 5 and the query is executed again)

Figure 7A:
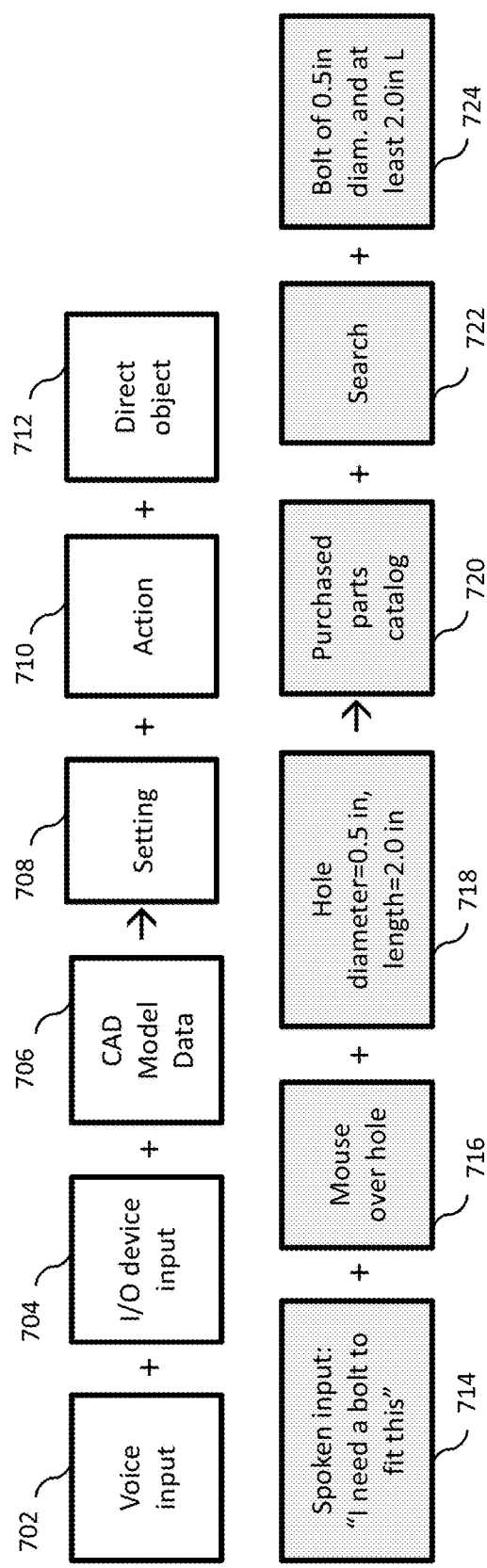
Figure 7B:
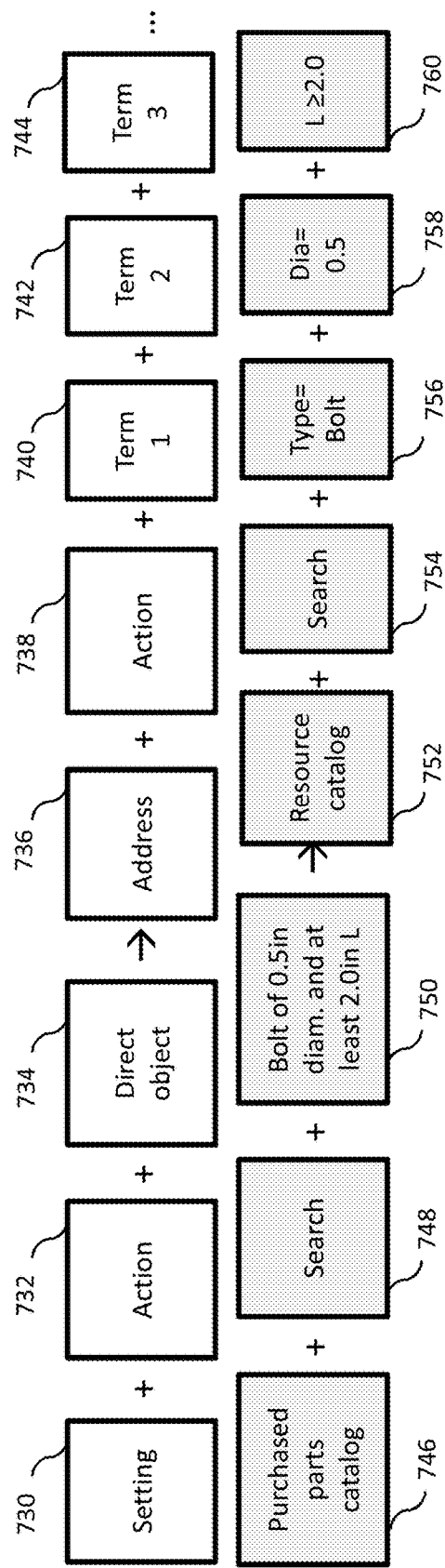

FIGS. 7A and 7B illustrate further alternative parsing and query algorithms, respectively, according to alternative embodiments of the invention. In each figure there are generic steps along the top row and a specific example in the boxes of the bottom row. In this alternative parsing algorithm there is voice input 702 plus I/O device input 704 plus CAD model data 706 that is the basis for output setting 708 plus action 710 plus direct object 712. The corresponding specific examples are, respectively, the voice input of natural language command program module 110 is "I need a bolt to fit this" 714 and mousing over the hole as I/O device input 716 plus CAD model data the hole diameter is half an inch and length is two inches 718, is the basis for a setting of purchased parts catalog 720, an action of search 722, and then the direct object or the search terms is "bolt of half an inch diameter and at least two inches length" 724.

TABLE 1

| | "Nalcop" | "can you find" | "a bolt" | "to fit" | "the selected" | "hole?" |
|---|---|---|---|---|---|---|
| Parsed Voice Input | | | | | | |
| I/O Device Association | N/A | N/A | N/A | N/A | "selected" = identify I/O device input for selected feature | N/A |
| Program Actions and Topics | "Nalcop" = Activate natural language program interface | "you find" = Action will be a search | "bolt" = Recognize CAD Context Term; Retrieve Term-Specific parameters for search from CAD Context Database | Identify selected feature and determine associated parameters (e.g. hole diameter, depth & surrounding material) Construct query: "fit . . . selected hole" [verb + direct object] = correlate feature parameters (e.g. hole diameter, depth & surrounding material) with CAD Context Term Specific Parameters (e.g. bolt diameter, length & material) and other purchased parts compatibility data. | | |
| CAD Context Database Interaction | N/A | N/A | Supply Term-Specific Parameters (for bolt, e.g., diameter, length, material) | N/A | | N/A |
| Resource Provider Extension Actions and Topics | N/A | Search | Address = McMaster Carr catalog Search term = bolt | Required corresponding CAD-interrogated information used to narrow search (e.g., Search term = diameter of hole; Search term = material; Search term = thickness of material) | | |

A second example follows that illustrates a variation of parameters when the request is for a stud rather than a bolt:

605 Voice Input—"Nalcop, can you find a stud to fit the selected hole?"
  608 I/O Device Input—Mouse clicks on a hole
  611 Parse Voice Input and determine actions and topics (Stud=diameter, length, material) by accessing CAD Context Database 500
  614 Determine required CAD model information (CAD information=diameter of hole, thickness of material, material)
  617 Analyze CAD model for required information (Diameter=0.25 in Thickness=0.090 in Material=Aluminum)
  620 Use formulae or engines to calculate further information (Diameter +/−0.10 in Thickness=/−0.007 in)
  623 Generate Query Addresses (PEM catalog Action: search—Term 1: "stud"—Term 2: "diameter=0.15 in to 0.35 in"—Term 3: "thickness=0.083 in to 0.097 in"—Term 4: "material=aluminum")
  626 Provide missing information (After query is executed, the length of the stud can be variable and The setting, action and object thus determined forms inputs to the query algorithm shown in FIG. 7B, wherein the setting 730 plus action 732 plus direct object 734 generate an address 736 plus action 738 plus search term(s) 740-744. These generic algorithm steps correspond, in this specific example, to, respectively, an actual query of purchased parts catalog 746 plus search 748 plus Bolt of 0.5 in diameter and at least 2 in length 750, provides a specific address of a resource catalog 752, a specific action of the search 754 and three search terms 756, 758 and 760 that come out of the direct object.

In one further embodiment, a local sub-server may be provided with specialized language databases that apply only to a group of designers so that the group may create or use their own individualized glossary commands and terms that might not be used by others outside the group and thus would not parse correctly. This would allow, for example, the users of that group to drop common adjectives from names when all parts have that name. For example, if all bolts were red, it would not be necessary for users within the identified group to specify a red bolt because the system would know the bolt color was red unless otherwise stated.

In another embodiment, a voice recognition sub-module may be included within natural language command program module 110 so that commands can be locked out from unrecognized voices to permit only authorized users to edit the CAD model. For example, such functionality may help to prevent untrained users from changing the CAD model inadvertently. Also, further functionality may be added to permit response by the system in natural language to questions about why a specific command or operation is not working. For example, if an initial command comprises a request to add a steel bolt to an aluminum structure and the system does not allow it because steel fasteners pull through the aluminum, the natural language command program module 110 would respond with an error message or say "this won't work" in audible tone all of the words—"this won't work for these reasons." This could be very helpful to users, especially for those people learning as they make mistakes and understand why it's wrong not just that it's wrong.

Another alternative embodiment may present help menu material tutorials as a natural language response, effectively reading the manual, so that, for example, the user may concentrate on the actions necessary with the keyboard and mouse without diverting his eyes to read from the screen.

Referring now to FIG. 8, an exemplary embodiment of a model descriptor database 148 is illustrated. Model descriptor database includes at least an object model descriptor 800; at least an object model descriptor 800 may include plurality of object model descriptors. Each object model descriptor may include at least a mathematical description 804 of a three-dimensional form of an object. At least a mathematical description 804 may include any description that any graphical modeling program, such as CAD module 106 or CAD modules 108*a-n*, may use to store and/or render geometric features of a modeled object, including without limitation CAD model 120. At least a mathematical description 804 may include parameters describing locations of vertices, edges, surfaces, volumes, or other elements of a graphical model of an object, with respect to any coordinate system used in a graphical modeling program. At least a mathematical description 804 may include any formula for any curve, surface, or area, with respect to any coordinate system used in a graphical modeling program. At least a mathematical descriptor may include, without limitation, a formula for rendering a geometric primitive, a formula for combining geometric primitives to form more complex structures, or formulas combining such complex structures to form new structures; formulas for combination may described both adding positive volume in the form of a given geometric primitive or combination thereof, or removal of volume in the form of a given geometric primitive or combination thereof. As a non-limiting example, at least a mathematical descriptor may include instructions to add a cylinder to a planar surface of another object, forming a model of that object with a cylindrical projection, an instruction to create a recess in the planar surface having the form of a rectangular prism, causing the object to be as before but with a recess, similar acts involving any geometric elements, or combinations of similar acts. At least a mathematical description 804 may describe edges, vertices, surfaces, volumes, or other elements of a graphical model in any mathematical terms, including in terms of points, lines, vectors, triangles (as in an "STL" file), or other conventions for rendering images. At least a mathematical description 804 may include a model stored in any manner used for storing a model in a modeling program model, such as a CAD model, as machine-readable data.

Still referring to FIG. 8, object model descriptor may include at least a parametric instruction 808. At least a parametric instruction 808 may be any instruction that combines with at least a mathematical formula to describe a full set of features of object model descriptor. At least a parametric instruction 808 may include an absolute or relative dimension such as a size, height, volume, ratio one geometric element to another, or the like. At least a parametric instruction 808 may include a particular values for one or more coefficients; for instance, where object model descriptor includes a Cartesian formula for a circle centered at the origin, $x^2+y^2=a$, at least a parametric instruction 808 may include the statement a=7, by reference to the norms or gradations used to measure distances in the coordinate system, or a=7 inches, as a reference to a unit of measurement. At least a parametric instruction 808 may include material requirements, such as one or more materials specified for manufacture of an object modeled using object model descriptor. At least a parametric instruction 808 may include a manufacturing method for manufacture of an object modeled using object model descriptor. At least a parametric instruction 808 may include a finish or coating for a surface of an object modeled using object model descriptor. At least a parametric instruction 808 may include a part number of one or more parts to be combined with an object modeled using object model descriptor. At least a parametric instruction 808 may be created, without limitation, by combining any existing object model descriptor with any characteristic as described below. At least a parametric instruction 808 may be stored in the same data structure or data location as at least a mathematical description 804; for instance, where a modeling program such as a CAD program is designed to store or retrieve models using a protocol that stores both at least a mathematical description 804 and at least a parametric instruction 808 together, model descriptor database 148 may store at least a mathematical description 804 and at least a parametric instruction 808 together according to that protocol.

Continuing to refer to FIG. 8, model descriptor database 148 may include at least a characteristic descriptor 812. At least a characteristic descriptor 812 may include one or more instructions for modifying at least an object model descriptor 800. As a non-limiting example, a characteristic descriptor may include an instruction to set one or more dimensions of an object model descriptor to a particular size by reference to a norm of a coordinate system or a unit of measurement; for instance, one characteristic descriptor may instruct that an object model descriptor be modified to have a particular maximum length along a specified axis in the coordinate system, or that a particular geometric primitive have a specified length, breadth, depth, axis length, volume and/or other dimensional parameter. As another non-limiting example, a characteristic descriptor may include an instruction to set one or more dimensions of an object model descriptor to a relative size; for instance, the length and breadth of a face, projection, or orifice described in object model descriptor may be sized to fit against, around, or in a feature of another object. As another example, a characteristic descriptor may instruct one element of object to be increased or decreased in length, breadth, depth, volume, or the like as a proportion of another element of object; for instance, a characteristic descriptor may require that a cylindrical object having an opening at one end be modified so that the opening has a greater cross-sectional area than the remainder of the cylinder, modifying the mouth to be a "wide mouth" such as those sometimes found on cups or drinking glasses.

Still viewing FIG. 8, at least a characteristic descriptor 812 may include one or more instructions for combining an object model descriptor with another object model descriptor; as a non-limiting example, the at least a characteristic descriptor 812 may instruct to remove a volume equal to one object modeled in a first object model descriptor from a face of another object described in a second object model descriptor. Revisiting the example of a wide-mouthed beverage holder, a first object model descriptor may describe a cylinder having a first internal diameter while a second object model descriptor may describe a funnel-like structure that has an initial end with a second internal diameter and a terminal end with a larger third internal diameter; a characteristic descriptor of at least a characteristic descriptor 812 may instruct resizing the second object model descriptor so that the second internal diameter matches the first internal diameter, while the third internal remains proportionally larger as before, and then combining the resized funnel structure with the cylinder to form a cylindrical structure with a wide mouth. At least a characteristic descriptor 812 may include any instruction to add any parametric instruction to any object model descriptor. Persons skilled in the art, upon reading the entirety of this disclosure, will be aware of many ways in which at least a characteristic descriptor 812 may instruct modification of at least an object descriptor.

With continued reference to FIG. 8, at least a mathematical description 804 may be created, among other means, by incorporating at least a characteristic descriptor 812; for instance, at least a mathematical description for a new object model descriptor may contain at least a mathematical description for one or more existent object model descriptors combined with one or more characteristic descriptors such as instructions for combining the one or more existent object model descriptors' mathematical descriptions and/or modifications thereto. Similarly, at least a parametric instruction 808 may include one or more characteristic descriptors 812; where, as disclosed in further detail below, a method creates a modified model of an object by combining a model generated from an object model descriptor with one or more characteristic descriptors, the modified model may be saved in model descriptor database 148 by creating mathematical descriptions and parametric instructions combining the mathematical descriptions and parametric instructions corresponding to the unmodified object with the one or more characteristic descriptors used to produce the modified object model. In this way, new object models can be built recursively by reference to previously existent object models.

Continuing to view FIG. 8, each of at least a characteristic descriptor 812 and/or at least an object model descriptor 800 may be associated with at least a descriptive word 816. At least a descriptive word 816 may include one or more words or phrases describing the object represented by an object model descriptor of the at least an object model descriptor 800 and/or the characteristic represented by a characteristic descriptor of the at least a characteristic descriptor 812. As a non-limiting example, at least a descriptive word 816 may include one or more words, phrases, or other terms used by a user to describe an object represented by an object model descriptor of the at least an object model descriptor 800; for instance, at without limitation, an object model descriptor associated with a drinking vessel may also be linked in model descriptor database 148 to a first descriptive word of "cup," a second descriptive word of "glass," and a third descriptive word of "mug," with the result that a query containing any one of those three words may occasion the retrieval of the object model descriptor. As a further non-limiting example, at least a descriptive word 816 linked to a characteristic descriptor of at least a characteristic descriptor 812 may include one or more words a user uses to describe a characteristic associated with the characteristic descriptor; for example, and without limitation, a characteristic associated with a circular opening of a cylinder that bevels out to a wider opening than an interior diameter of the cylinder may be associated with a first descriptive word of "wide mouth" and a second descriptive word of "open mouth," with the result that a query containing any one of those three words may occasion the retrieval of the characteristic descriptor. A descriptive word of at least a descriptive word 816 may be added to model descriptor database 148 when a new object model descriptor or characteristic descriptor is created as described below; additional descriptive words may be added where a user enters one or more new words that become associated with an existing object model descriptor and/or characteristic descriptor, such as when the existing object model descriptor and/or characteristic descriptor is retrieved to match a user-submitted image as describe below in reference to FIG. 12. Words of instruction submitted by a user to produce modified object model or in other user commands as described regarding methods disclosed herein may also be inserted as one or more descriptive words 816.

With continued reference to FIG. 8, object model descriptors 800 may be defined recursively; for instance, an object model descriptor 800 corresponding to a combination of other object model descriptors and rules for combination of the other object model descriptors may have at least a mathematical description 804 containing a reference to one or more of the other object model descriptors; a parametric instruction may indicate how the one or more other object model descriptors are modified to combine together and form the object model. As a result, some object model descriptors of the at least an object model descriptor 800 may include descriptions of geometric primitives, while others may include references to geometric primitives, combined with instructions for combining them into a more complicated object; the same combination may be performed combining a plurality of more complex object models and/or combining more complex object models with geometric primitive, associated with one or more words that a user might use to describe the objects in question. May also include associations to existing models of objects. Model descriptor database 148 may be implemented using any hardware or software module or modules suitable for the implementation of any database as described above, including without limitation CAD context database 500. Model descriptor database 148 may be implemented on the same device or devices housing CAD context database 500, or on a different device or devices.

Figure 9:
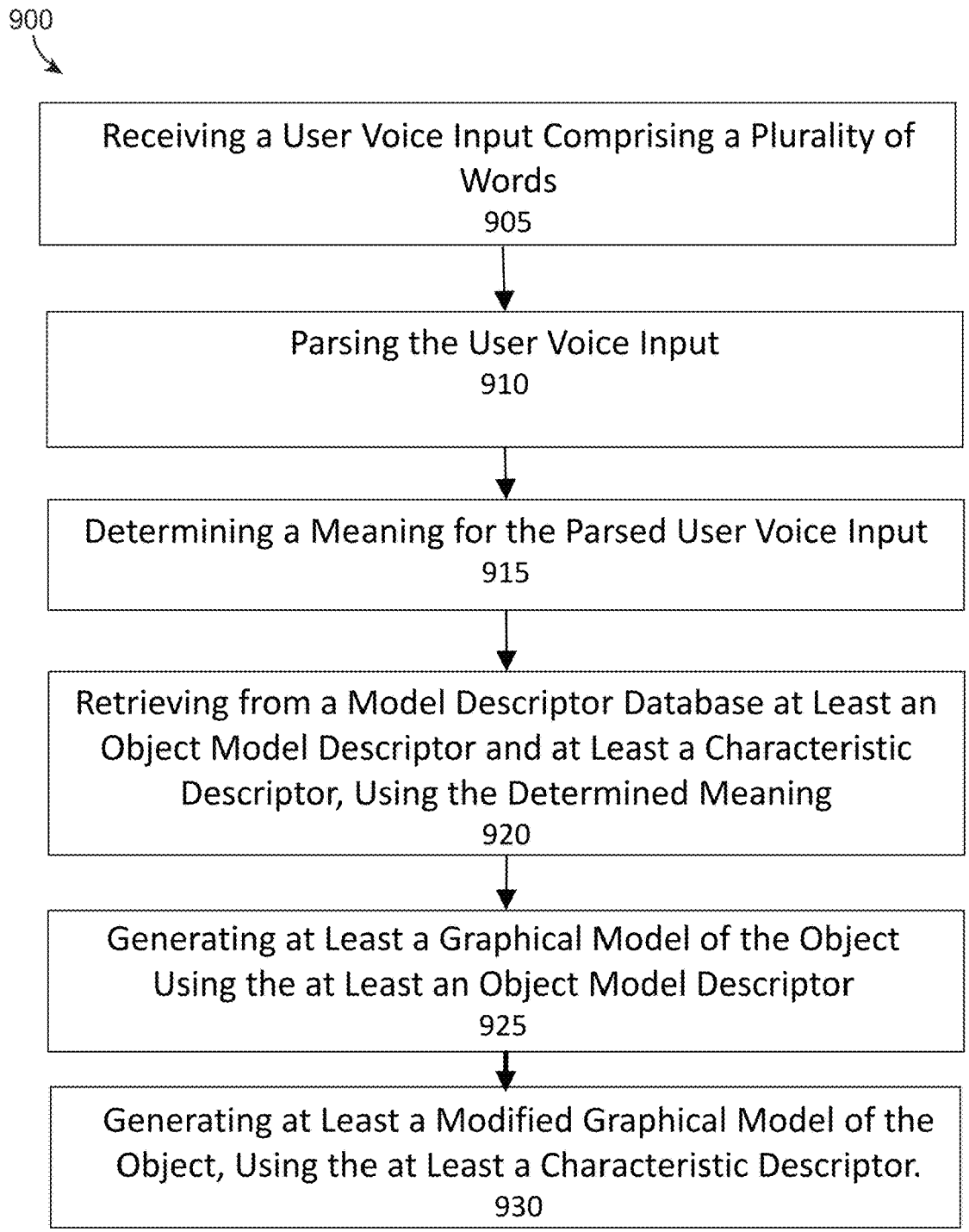
FIG. 9 represents an exemplary method for providing a natural language interface for a computer-aided design (CAD) system in an embodiment.

Referring now to FIG. 9, an exemplary embodiment of a method 900 for providing a natural language interface for a computer-aided design (CAD) system is illustrated. At step 905, a voice input containing a plurality of words is automatedly received via a computing device. In an embodiment, this may be implemented as described above in reference to FIGS. 1A-8. At step 910, the user input is automatedly parsed via the computing device; this may be implemented as described above in reference to FIGS. 1A-8.

Still referring to FIG. 9, at step 915, a meaning is automatedly determined via the computing device; determination of meaning may be performed generally as described above in connection with FIGS. 1A-8. Determined meaning may include one or more words associated with an object and one or more words associated with a characteristic of the object. Characteristic may be any characteristic that may be associated with at least a characteristic descriptor 812 as described above.

Continuing to refer to FIG. 9, at step 920, at least an object model descriptor 800 and at least a characteristic descriptor 812 are retrieved from a model descriptor database 148 via the computing device. Retrieval of at least an object model descriptor 800 may include assembling a query using one or more words associated with an object; model descriptor database 148 may be queried using the assembled query. Retrieval of the at least a characteristic descriptor 812 may include assembling a query using one or more words associated with a characteristic; model descriptor database 148 may be queried using the assembled query. A combined query may additionally or alternatively be generated, for instance to locate at least an object model descriptor 800 matching both one or more words matching object and one or more words associated with characteristic of the object, or for receiving results combining the two in a single line of results; for instance, each characteristic descriptor matching the one or more words associated with a characteristic, and each object model descriptor matching the one or more words associated with the object may be combined to form a distinct result returned by model descriptor database 148, presenting a plurality of responses to the query. At least an object model descriptor 800 may be retrieved by matching at least a descriptive word 816 linked to at least an object model descriptor 800 with the one or more words associated with the object. At least a characteristic descriptor 812 may be retrieved by matching at least a descriptive word 816 linked to at least a characteristic descriptor with the one or more words associated with the characteristic. At least an object model descriptor 800 may include at least a mathematical description 804 of a three-dimensional form of the object and at least a first parametric instruction for manufacturing the object using the three-dimensional object form, for instance as described above in reference to FIG. 8.

At step 925, and with continued reference to FIG. 9, at least a graphical model of the object is automatedly generated using the at least an object model descriptor 800 via the computing device. In an embodiment, where at least an object model descriptor 800 is stored in a manner used by a modeling program, such as a CAD module 106, 108*a-n* to store a graphical model, such as CAD model 120, generating at least a graphical model of the object may be performed according to any protocol used by modeling program to generate graphical models in general. Thus, generating the object model may include retrieving, from the model descriptor database 148, at least a graphical model associated with the object model descriptor, where retrieving a graphical model is performed in the same way that modeling program retrieves any model from memory. Generating object model may include rendering the three-dimensional object form according to at least a mathematical description 804; this may or may not be performed according to modeling program processes for retrieving and rendering graphical models from memory.

Still referring to FIG. 9, generating object model may include retrieving at least a modification to the at least a graphical model associated with the object model descriptor. At least a modification may be stored as at least a parametric descriptor; alternatively or additionally, at least a modification may be stored as a characteristic descriptor. At least a modification may be associated with object model descriptor, for instance by inclusion as at least a parametric descriptor included in or referred to by object model descriptor or as a characteristic descriptor referred to by object model descriptor. Generating object model may further include modifying at least a graphical model using the at least a modification. Thus, in an embodiment, generating object model may include retrieving, from the model descriptor database 148, at least a graphical model associated with the object model descriptor, retrieving at least a modification to the at least a graphical model, and modifying the at least a graphical model. In an embodiment, generating object model may include rendering three-dimensional object form according to at least a mathematical description 804 and modifying the three-dimensional object form using at least a modification; at least a modification may include at least a parametric instruction 808. Object model may be generated as a function of three-dimensional object form and at least a modification.

Continuing to refer to FIG. 9, at least an object model descriptor 800 may include a plurality of object model descriptors, and generating at least a graphical model of object may include generating a plurality of graphical models of the object, each of the plurality of graphical models of the object generated using an object model descriptor of the plurality of object model descriptors. For instance, and without limitation, a query provided to model descriptor database 148 may produce multiple results as described above. Each result, which may include an object model descriptor and/or a characteristic descriptor, may be separately rendered, producing various graphical models responsive to the query, as generated from the user voice input.

At step 930, and still referring to FIG. 9, at least a modified graphical model of object is generated via computing device using the at least a characteristic descriptor 812. At least a modified graphical model of object may be created by providing a modeling program, such as CAD module 106 and/or 108*a-n* as described above, with a command to include at least a characteristic in modified graphical model of object; this may be implemented as described above in reference to FIGS. 1A-8.

Figure 10A:
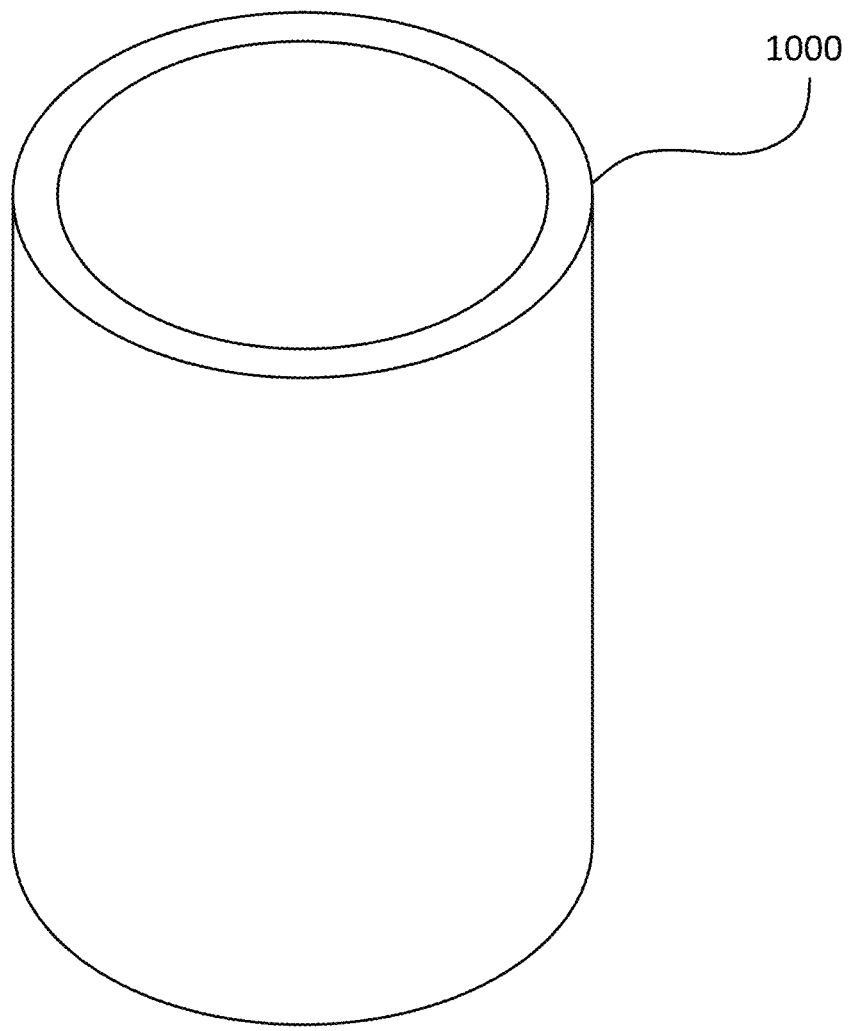
FIGS. 10A-C represent exemplary isometric diagrams of graphical models of objects as described herein in an embodiment.
Figure 10B:
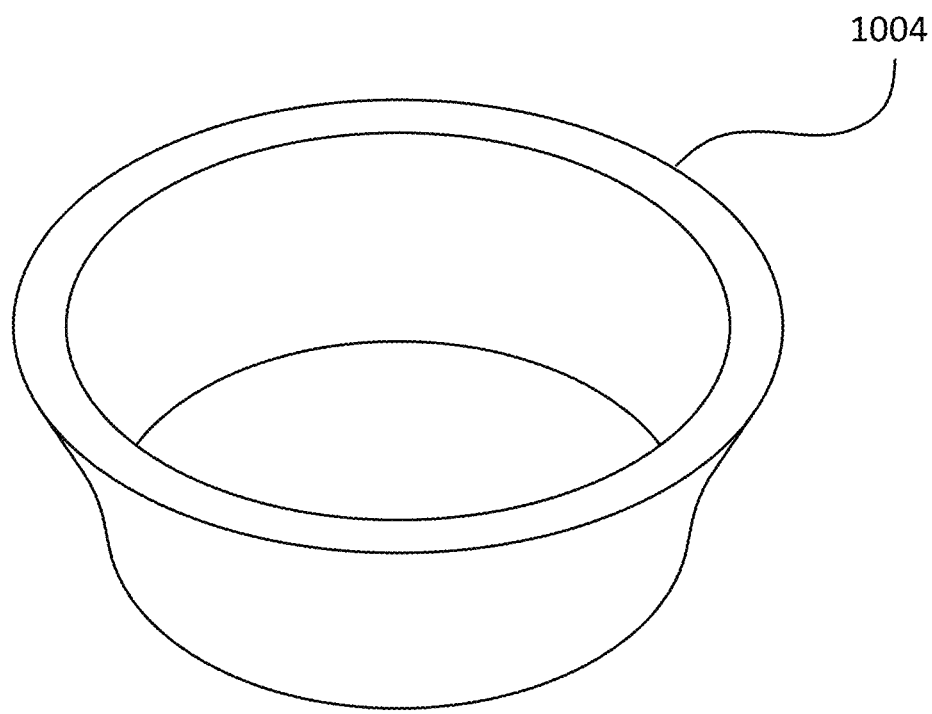
Figure 10C:
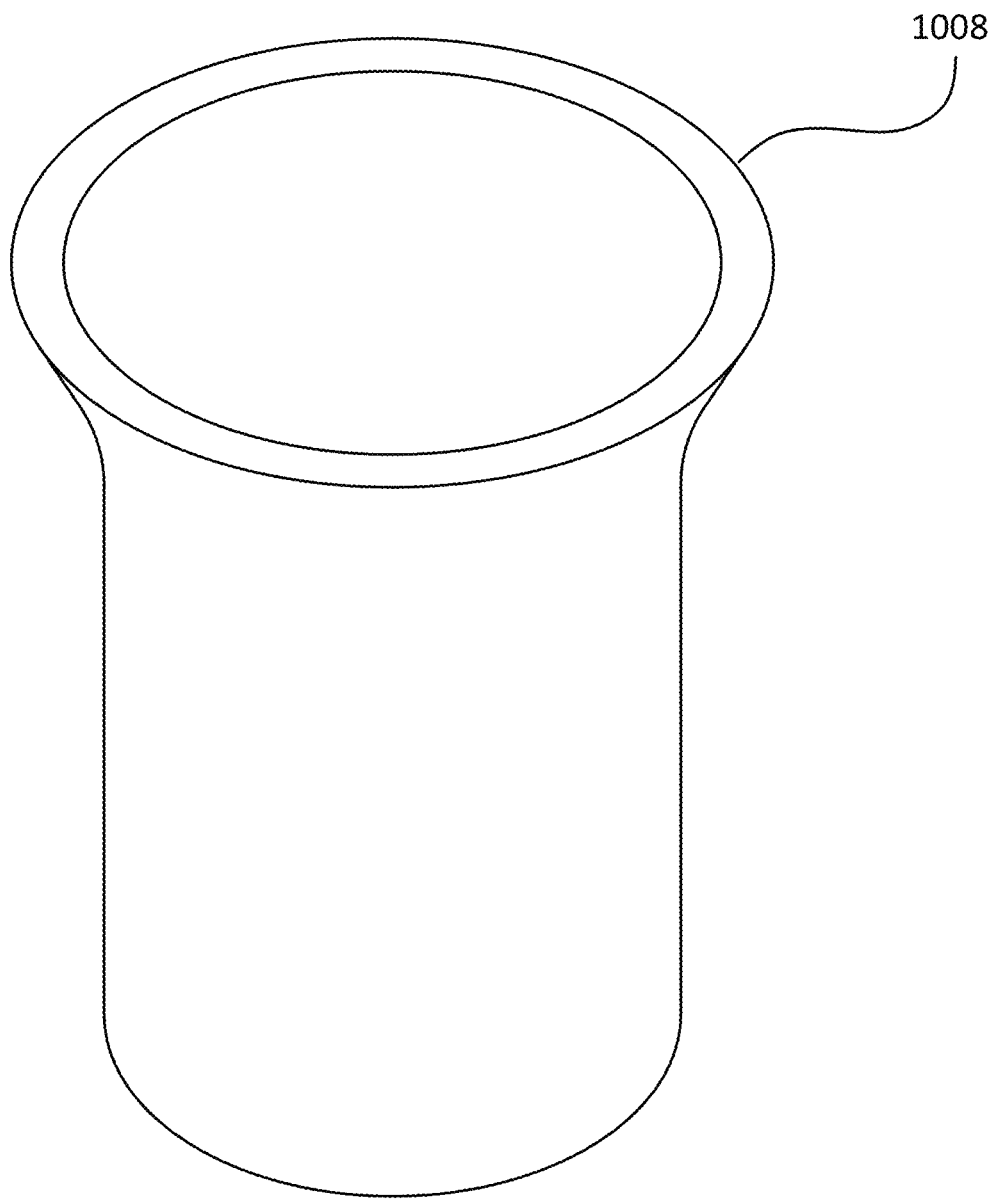

Referring now to FIGS. 10A-C, some non-limiting examples for the above-mentioned process of modifying at least a graphical model of object are provided; these examples are provided only for the purpose of aiding in the visualization of embodiments of method 900 as described herein, and should not be construed as limiting the scope of method 900 in any way. As a non-limiting example, a first graphical model 1000 of object may depict a particular three-dimensional figure modeling the object; for instance, and without limitation, a cylindrical drinking vessel, which may have been retrieved in response to a user voice input containing the word "cup" or the like. A characteristic descriptor retrieved as described above may include a reference to a second object model descriptor rendered as a second graphical model 1004; characteristic descriptor may include instructions for modifying first graphical model 1000 by the inclusion of second graphical model. As a non-limiting example, second graphical model 1004 may include a funnel-shaped object that links a narrower circular opening to a broader circular opening, which may be associated with a second part of user command requesting a "wide mouth." Alternatively or additionally, characteristic descriptor may include an instruction to modify one or more portions of a model such as first graphical model 1000, for instance, by instructing that a circular opening be widened by increasing its diameter and including a beveling portion at that end of a cylinder having the circular opening.

Continuing to refer to FIGS. 10A-C, a modified graphical model 1008 may be formed using characteristic descriptor; for instance, where characteristic descriptor refers to a second graphical model 1004, first graphical model 1000 may be modified to include second graphical model, which may involve without limitation adding second graphical model 1004 to a particular location of first graphical model 1000, removing a volume corresponding to second graphical model 1004 from first graphical model 1000, and/or replacing a portion of first graphical model 1000 with a part or all of second graphical model 1004; as a non-limiting example, a portion of an end of a cylindrical drinking cup may be replaced with a funnel-shaped object, producing a version of the cylindrical drinking cup having a mouth that bevels outward to form a wider opening. First or second model may also be modified according to instructions of characteristic descriptor or of another characteristic descriptor; continuing the non-limiting example, for instance, funnel shaped object may be resized to match the wall thickness and inner diameter of cylindrical drinking vessel. Alternatively or additionally, interrogator engine may identify a mismatch between objects and automatedly modify one or the other to permit a fit. Where characteristic descriptor is an instruction for modifying one or more dimensions or geometries of first model 1000, first model may be modified accordingly; as a non-limiting example, an opening of first model 1000 may be widened to produce modified model 1008.

Referring again to FIG. 9, in an embodiment, modifying at least a graphical model of object may include modifying each of a plurality of graphical models as a function of the at least a characteristic; for instance, where query returns a plurality of object model descriptors, resulting in the generation of a plurality of graphical models of objects, at least a characteristic may be used to modify each graphical model of the plurality of graphical models. In an embodiment, the at least a characteristic descriptor 812 may include a plurality of characteristic descriptors; for example, a query entered to model descriptor database 148 using one or more words associated with characteristic may return multiple results matching the one or more words. Where a plurality of characteristic descriptors is returned, modifying at least a graphical model of the object may include generating a plurality of modified graphical models, the plurality of modified graphical models including a modified graphical model representing the at least an object modified using each characteristic descriptor of the plurality of characteristic descriptors; in other words, each graphical model of the at least a graphical model of the object may be modified with each characteristic descriptor of the plurality of characteristic descriptors. Where a plurality of object model descriptors and a plurality of characteristic descriptors are retrieved, this may result in a large number of modified graphical objects.

Still viewing FIG. 9, in an embodiment, at least a characteristic descriptor 812 may include a modification to at least a mathematical description 804 of graphical model of the object; in that case, modification of graphical model of object may include modifying the graphical model of the object as a function of the modification. At least a characteristic descriptor 812 may include a descriptor associated with at least a geometrical model, such as another object model descriptor; modifying graphical model of object using the at least a characteristic descriptor 812 may include adding the at least a geometric model to the graphical model of the object. At least a characteristic descriptor 812 may include at least a mathematical description 804 of a three-dimensional characteristic form represented in geometric model and at least a second parametric instruction for manufacturing the characteristic using the three-dimensional characteristic form; modification may therefore include modifying the geometric model using the at least a second parametric instruction and adding the geometric model so modified to the at least a graphical model of the object. Where determining the meaning of the user voice input involves determining one or more words associated with a specific location on object, adding at least a geometrical model to graphical model of the object may include identifying the representation of the specific location in the graphical model of the object and adding the at least a geometric model at the representation of the specific location. This may be performed as described above in reference to FIGS. 1A-8.

Continuing to refer to FIG. 9, in an embodiment, an interrogator engine operating on the computing device, which may include without limitation CAD model analyzer 114, may determine that a characteristic descriptor of at least a characteristic descriptor 812 is incompatible with a graphical model of object of at least a graphical model of object. Determination of incompatibility may be performed as described above and in above-mentioned material incorporated by reference for determination of incompatibility by an interrogator engine. In an embodiment, characteristic descriptor may be modified to be compatible with graphical model of object; for instance, where characteristic descriptor includes or refers to a model of an additional object to be attached to object, and one or more dimensions of additional object are determined to be too large or small by interrogator, one or more dimensions in a model of additional object may be modified to have the correct size for compatibility. Alternatively or additionally, graphical model of object may be modified to be compatible with characteristic descriptor. Combination of characteristic descriptor and graphical model of object may be excluded from at least a modified graphical model of the object based on detected incompatibility; for instance, where the graphical model of the object is a model of an object made of a first material and characteristic descriptor is for a finish that may only be applied to an alternate material, the combination of the two may be eliminated from the set of combinations presented in at least a modified graphical model of the object.

Still viewing FIG. 9, additional information describing object may be automatedly identified in a CAD context database; this may be performed as described above in reference to FIGS. 1A-8. For instance, where one or more words describing object model do not furnish a query that generates sufficient results, either because the result set is null or too small, or because a typical result from the result set matches too little of the query, system 100 may generate a query to CAD context database to find additional information usable to improve the query. CAD context database may also be queried based on determinations as described above in reference to FIGS. 1A-8. Retrieving at least an object model descriptor 800 may additionally involve retrieving at the at least an object model descriptor 800 using additional information; in an embodiment, one or more words may be replaced by words included in the additional information. Alternatively or additionally, words included in the additional information may be added to query without replacing one or more words. For instance, CAD context database 500 may link one or more words of user voice input to categories or geometries; as a non-limiting example, CAD context database 500 may link the word "cup" to words describing upwardly opening recesses, cylindrical forms, or the like. Additional information may result in return of "best match" queries that, as indicated by CAD context database 500, may describe some but not all features of the object to which user voice input refers. Additional information in CAD context database 500 may also link a word user voice input used to describe a characteristic to words model descriptor database 148 links to particular characteristic descriptors; this may enable system 100 to match a user instruction with one or modifications to at least a graphical model of object that may partially or wholly match user needs. This may be performed, for instance, when a number of object model descriptors and/or characteristic descriptors initially returned by model descriptor database 148 is below a certain threshold, such as without limitation if no object model descriptors and/or no characteristic descriptors are initially returned. Additional information may similarly be used to retrieve at least a characteristic descriptor.

With continued reference to FIG. 9, as described above in reference to FIGS. 1A-8, system 100 may determine that additional information is necessary to perform method 900. In that case, a query for additional information may be automatedly assembled via the computing device, based on determined meaning, as described above in reference to FIGS. 1A-8. Query for additional information may be automatedly provided to a resource provider service via computing device, for instance as described above in reference to FIGS. 1A-8. Additional information may be automatedly received from resource provider service as described above in reference to FIGS. 1A-8; additional information may include information regarding object. Object model identifier may be retrieved using additional information; additional information may be used to retrieve object model identifier in any manner described above for use of additional information obtained from CAD context database. For instance, resource provider service may link one or more words of user voice input to categories or geometries; as a non-limiting example, Resource provider service may link the word "cup" to words describing upwardly opening recesses, cylindrical forms, or the like. Additional information may result in return of "best match" queries that, as indicated by Resource provider service, may describe some but not all features of the object to which user voice input refers. Additional information in Resource provider service may also link a word user voice input used to describe a characteristic to words model descriptor database 148 links to particular characteristic descriptors; this may enable system 100 to match a user instruction with one or modifications to at least a graphical model of object that may partially or wholly match user needs. This may be performed, for instance, when a number of object model descriptors and/or characteristic descriptors initially returned by model descriptor database 148 is below a certain threshold, such as without limitation if no object model descriptors and/or no characteristic descriptors are initially returned; query to resource provider services may, as a non-limiting example, be performed after query to CAD context database 500 fails to produce additional object model descriptors and/or characteristic descriptors in excess of a threshold, which may be the same threshold described above.

Continuing to refer to FIG. 9, a request for missing information may be provided to a user. This may be performed as described above in reference to FIGS. 1A-8. Request for additional information may be provided to a user where a number of object model descriptors and/or characteristic descriptors initially returned by model descriptor database 148 is below a certain threshold, such as without limitation if no object model descriptors and/or no characteristic descriptors are initially returned either before or after modification of query using CAD context database 500 and/or resource providers as described above. Requests for additional information may also be generated on discovery of incompatibility of models to be combined or of characteristic with object, for instance as detected by interrogator engine in accordance with any means or methods described above in reference to FIGS. 1A-8 or within materials incorporated herein by reference.

Still referring to FIG. 9, at least a modified graphical model may be displayed to a user. This may be performed using GUI 136 as described above. Where at least a modified graphical model includes a plurality of graphical models, the plurality of graphical models may be displayed to the user; plurality may be ranked, for instance according to degree of match with query, and displayed in rank-order. Plurality may be filtered or capped as described above. A selection of a modified graphical model from the plurality of modified graphical models may be received from a user; for instance, user may use a locator device such as a mouse, a keyboard, or an additional voice command to select a graphical model of the plurality of graphical models. In an embodiment, object model and/or characteristic descriptor as retrieved may not match what the user had in mind when describing object and/or characteristic; user may choose a most relevant version of modified graphical model from a plurality thereof. Such "partial matches" may be produced by one or more words of the user query matching an object model descriptor or characteristic descriptor that differs to a greater or lesser extent from what the user intended; partial matches may also be generated by CAD context database 500 and/or resource providers that have generated related words to the words the user produced. It is contemplated that any steps of method 900 or of any other method herein may be used one or more times to further modify user queries, graphical model of object, modified graphical model of object, and the like; for instance, user can specify a further modification to a graphical model of object, whether by reference to an additional characteristic or through use of voice-controlled CAD processes described above or below, to further shape the final result into a model matching the user's vision. Any completed or partially completed modified graphical model of object may be stored in its turn in model descriptor database 148; words associated therewith as stored in model descriptor database 148 may include one or more words of user query and/or additional information received from CAD context database 500 and/or resource providers.

Still referring to FIG. 9, method 900 may include initiating manufacture of the object using the modified graphical model of the object. Initiating manufacture may involve commencing any manufacturing process that may be performed by a manufacturing system. A manufacturing system may include one or more automated manufacturing devices such as, without limitation subtractive manufacturing devices such as computer numerical control (CNC) machines, machine tools, and the like, additive manufacturing devices such as three-dimensional printers, stereolithographic devices, and the like, cutting, stamping, or electronic discharge machining (EDM) devices. Initiating manufacture may include receiving, at an input port of system 100, a manufacture initiation signal, which may be any user command to initiate manufacture as described herein. Initiating manufacture may include generating a manufacture guidance file, such as a design file, a computer aided manufacturing (CAM) file, or the like, which may be implemented on system 100 or a remote device. Initiating manufacture may include generating manufacturing instructions, which may include one or more steps for an automated manufacturing device to perform in a manufacturing process. Manufacturing instructions may be generated by system 100 or by a remote device at the direction of system; direction of remote device to generate manufacturing instructions may be performed by transmitting a computer model, such as modified graphical model of object to remote device, without associated and/or embedded instructions to create manufacturing instructions. Initiating manufacture may include starting a manufacturing device; starting a manufacturing device may include transmitting manufacturing instructions to manufacturing device. Starting a manufacturing device may include transmitting a design file to manufacturing device 712. Starting a manufacturing device may include transmitting a signal to manufacturing device that the manufacturing device is configured to interpret as causing manufacturing device to perform physical operations as described above. Transmission, as used herein, may be direct, via a network, via a memory storage device, or via another automated manufacturing device.

In an embodiment, method 900 permits a user to produce a new product, from conception to manufacture, using a verbal description to the system 100; a vocabulary of words describing objects and potential modifications thereto, as understood in colloquial language, is translated into models and instructions for modifications thereof that system 100 may then use to generate a model and/or object, matching a statement by a user. A user with no technical knowledge may use this process to produce a prototype of a new design using a verbal description in the user's own words, translated into precise operational instructions by artificial intelligence, language analysis, and reference to a vocabulary of simple and complex forms.

Figure 11:
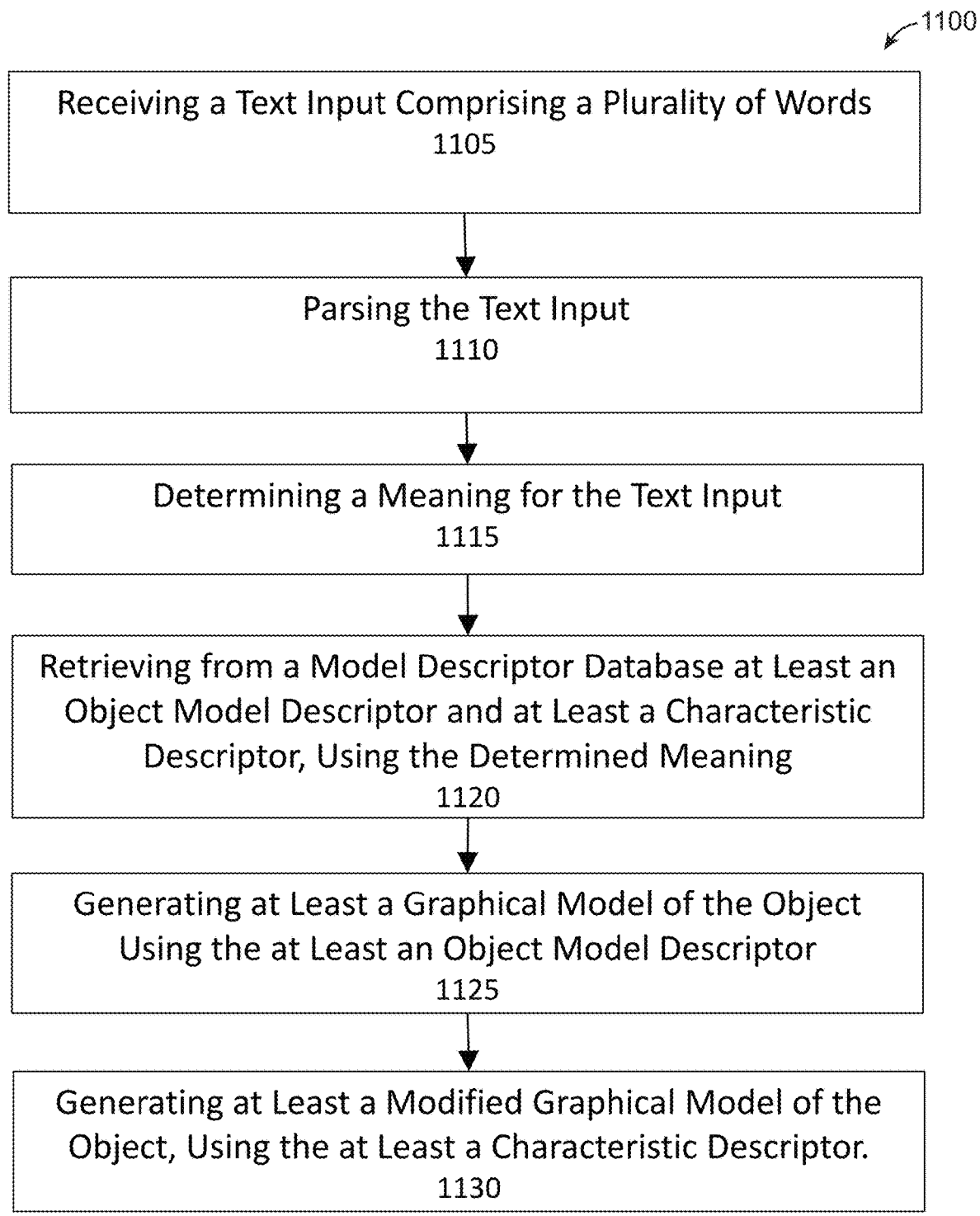
FIG. 11 represents an exemplary method for providing a natural language interface for a computer-aided design (CAD) system in an embodiment.

Referring now to FIG. 11, an exemplary embodiment of a method 1100 for providing a natural language interface for a computer-aided design (CAD) is illustrated. At step 1105, a user text input including a plurality of words is received. Text input may be received using any suitable input method. Text input may be entered by a user by means of a keyboard, touchscreen, touchpad, keypad, or other input device capable of receiving text. Text input may be received as a voice input that is translated into text using voice-recognition software. At step 1110, user text input is automatedly parsed via the computing device; this may be performed as described above in reference to FIGS. 1A-9. At step 1115 a meaning is determined for parsed user text input, the meaning including one or more words associated with an object and one or more words associated with a characteristic of the object; this may be implemented as described above in reference to FIGS. 1A-9. At step 1120, at least an object model descriptor 800 and at least a character descriptor are retrieved from a model descriptor database 148 using determined meaning, via computing device. In an embodiment, this may be implemented as described above in reference to FIG. 9. At step 1125, at least a graphical model of object is generated using at least an object model descriptor 800; this may be implemented as described above in reference to FIG. 9. At step 1130, graphical model of object t is modified using at least a characteristic descriptor 812. In an embodiment, this may be implemented as described above in reference to FIG. 9.

Any step or steps of methods 900 and/or 1100 may be repeated, omitted, and/or combined with any step or sets of steps of any other method described or alluded to herein, including without limitation use of methods 900 or steps of methods 900 and/or 1100 to further modify models generated in method 1200 and/or models retrieved from or added to model descriptor database 148 for instance and without limitation as described below regarding method 1500.

Figure 12:
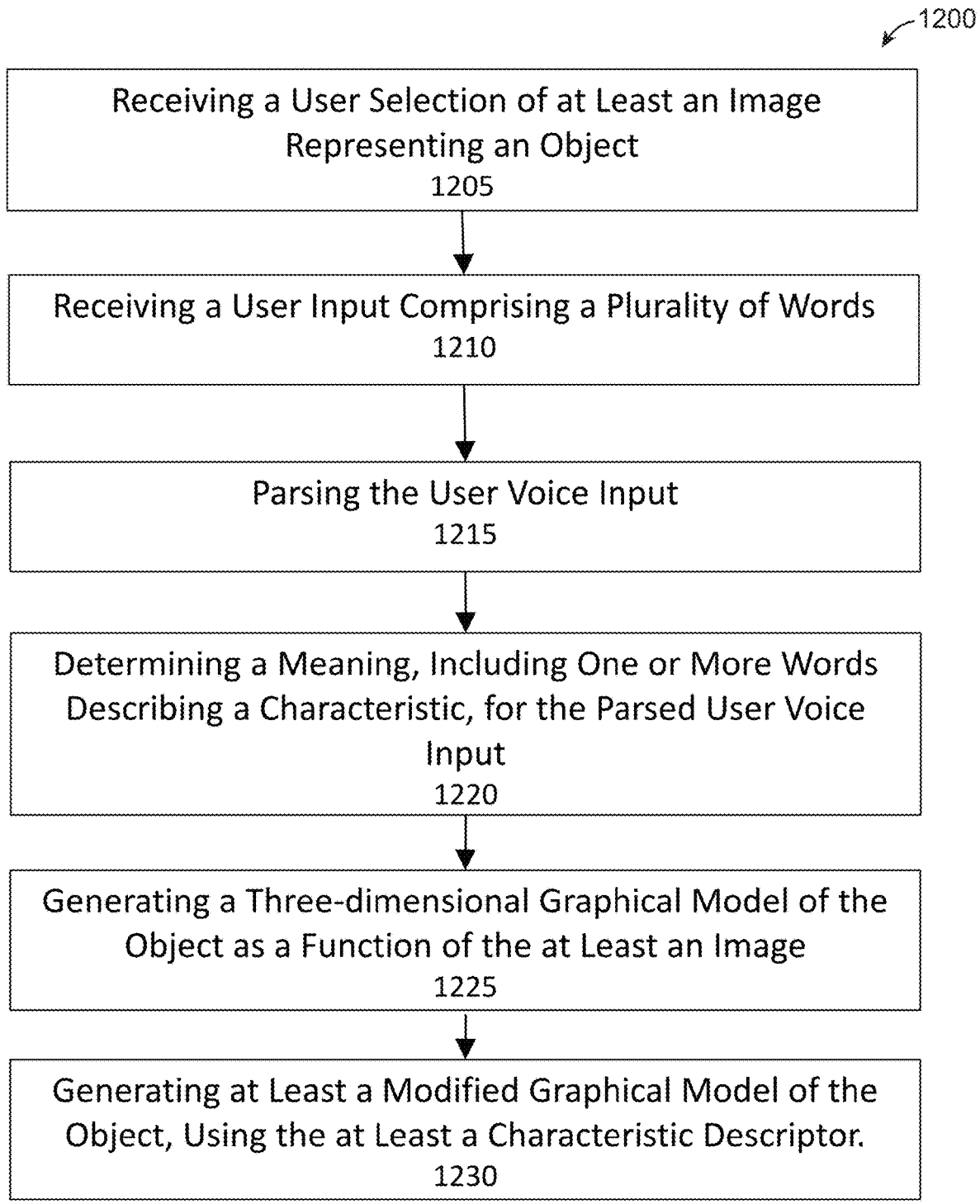
FIG. 12 represents an exemplary method for providing a natural language interface for a computer-aided design (CAD) system in an embodiment.
Figure 13A:
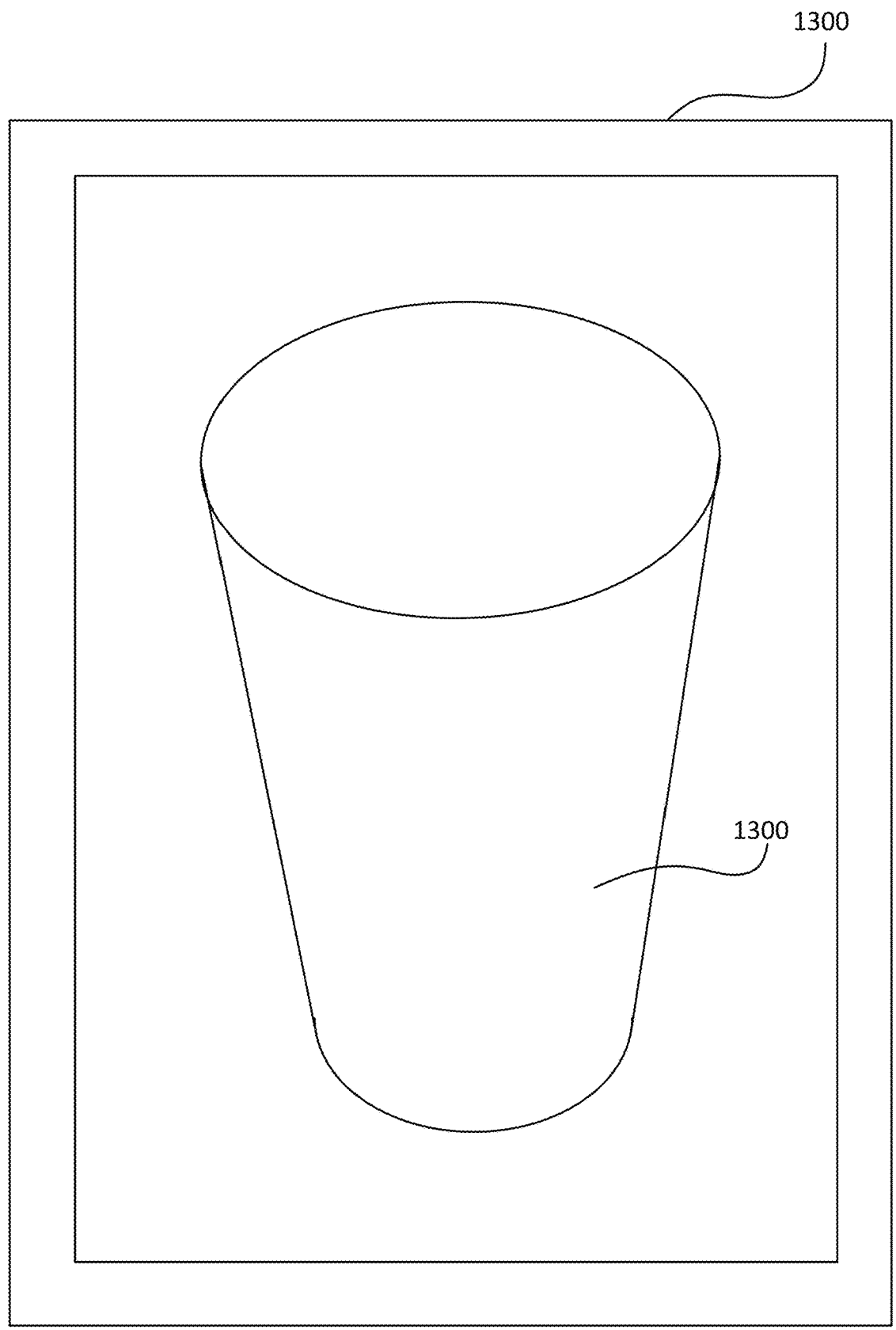
FIGS. 13A-D represent exemplary diagrams of steps for conversion of a two-dimensional image to a three-dimensional image as described herein in an embodiment.
Figure 13B:
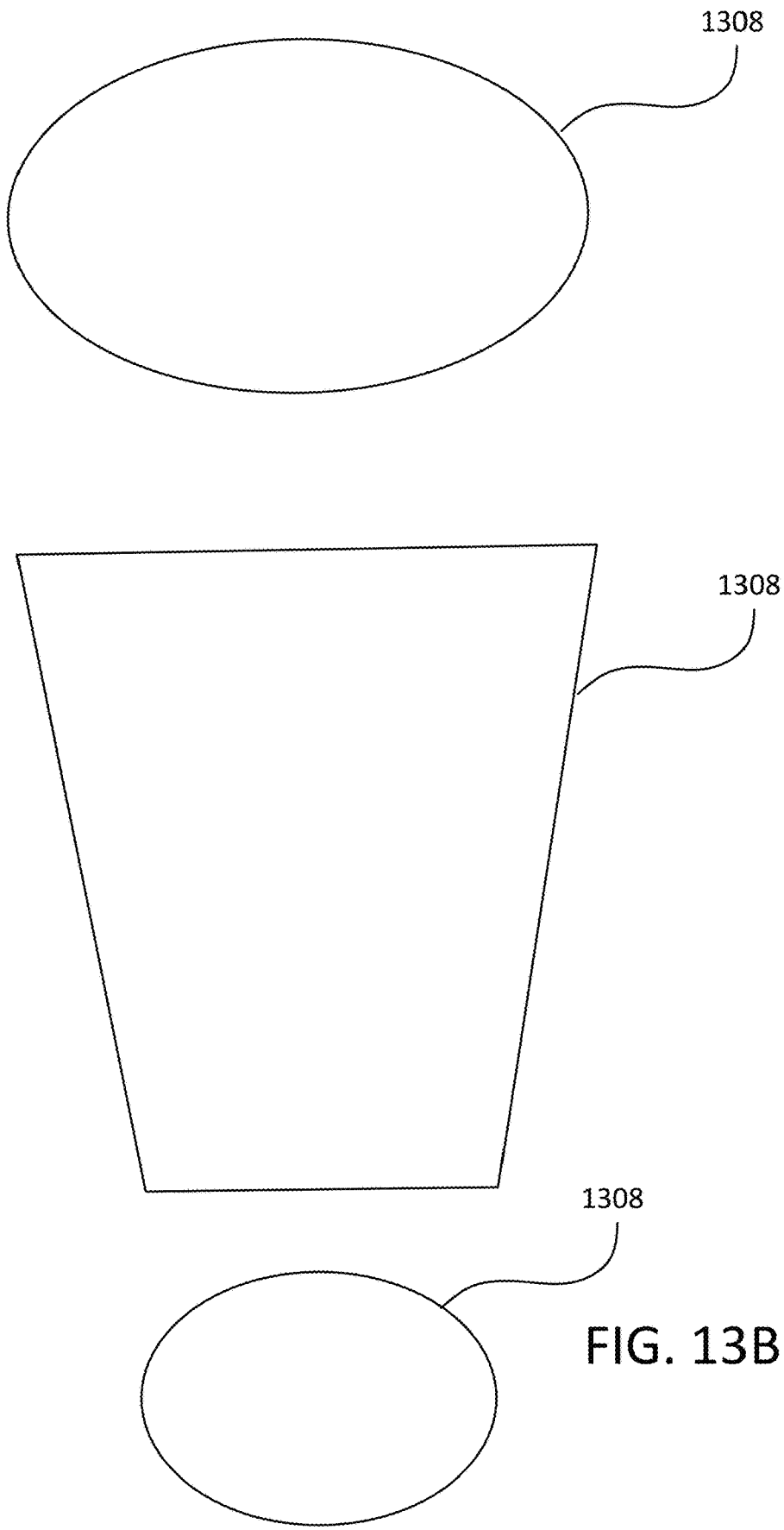
Figure 13C:
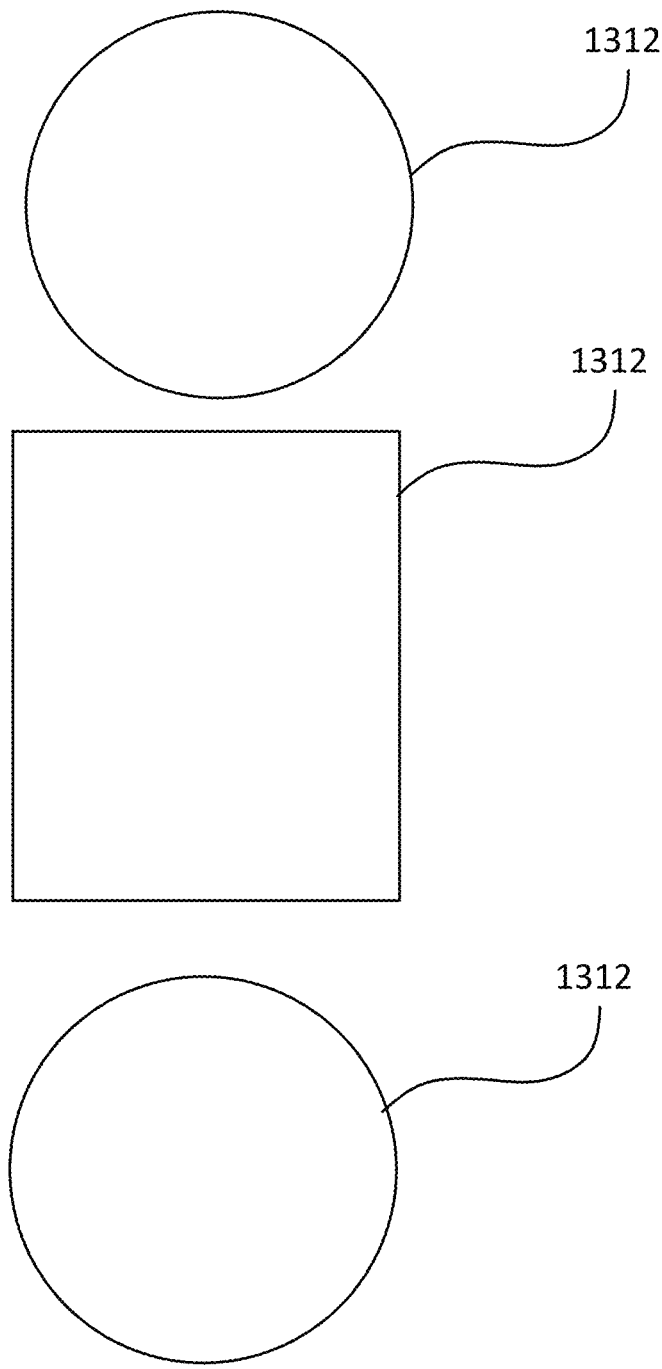
Figure 13D:
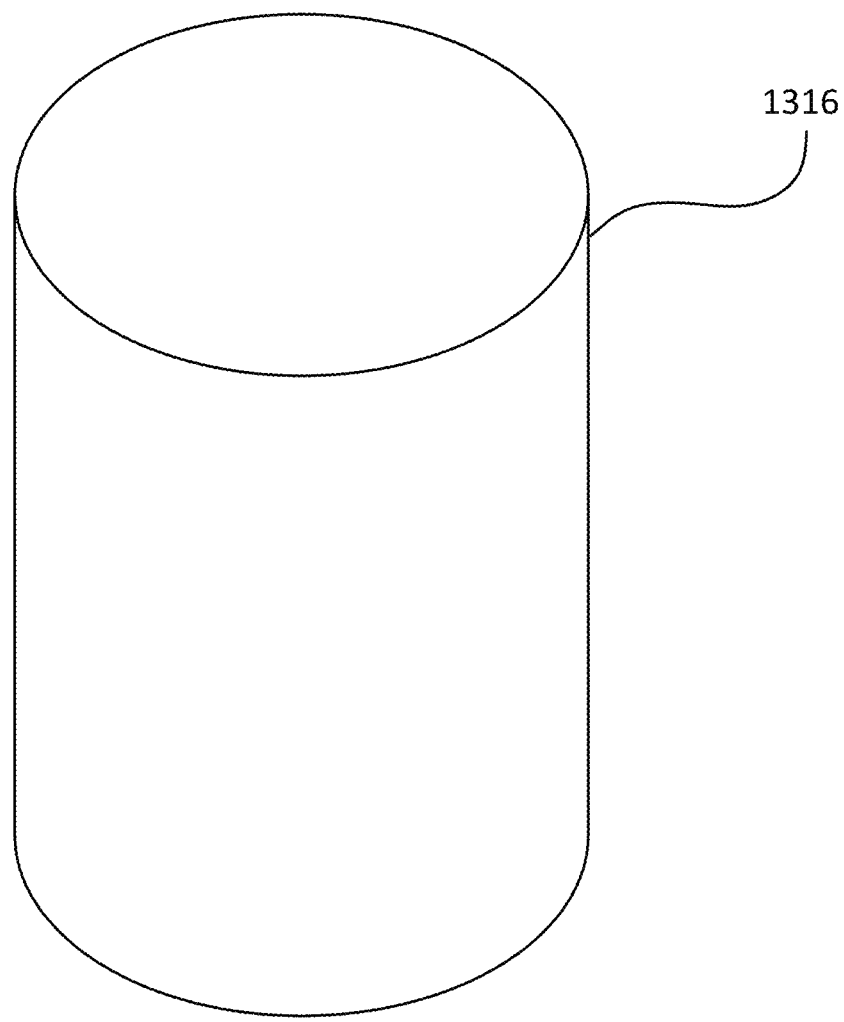

Turning now to FIG. 12, an exemplary embodiment of a method 1200 for providing a natural language interface for a computer-aided design (CAD) system is illustrated. At step 1205, a user selection of at least an image is automatedly received via a computing device. Receipt of user selection of at least an image may include receipt of at least an image from the user, via a network connection or from an electronic memory storage medium. Receipt of the image may be performed by capturing an image of an object; capturing may include scanning or photographing at least an image of the object. Capturing may include scanning or photographing object directly; for instance, a set of images may be produced by photographing object from one or more angles. Object may be scanned to produce a three-dimensional image of object, for example using computed tomography (CT) scanning techniques or the like. Alternatively or additionally, user may provide a link or reference to at least an image stored in memory accessible to computing device or to a network address where at least an image may be collected.

Still viewing FIG. 12, at least an image may include a three-dimensional graphical model of object. Three-dimensional graphical model may be any three-dimensional graphical model as described above, including without limitation a CAD model of object. Three-dimensional graphical model may be generated automatedly from a three-dimensional scan such as a CT scan; as a non-limiting example, this may be accomplished using one or more computer modeling programs, including without limitation one or more CAD modules 106 or 108a-n. Three-dimensional graphical model may be generated by a user utilizing one or more computer programs including without limitation one or more CAD modules 106 or 108a-n. In another embodiment, the at least an image includes at least a two-dimensional image, such as a photograph or two-dimensional CAD model illustrating a view of object; view may be a straightaway side view, an isometric view, a perspective view, or the like.

At step 1210, and still referring to FIG. 12, a user input including a plurality of words is received. User input may be a user voice input. User input may be a user text input. This may be implemented as described above in reference to FIGS. 1A-9. At step 1215, the user voice input is automatedly parsed via the computing device; in an embodiment this may be implemented as disclosed above in connection with FIGS. 1A-9. At step 1220, a meaning including one or more words associated with a characteristic is determined for the parsed user input; this may be performed according to any means or manner for determining a meaning including one or more words associated with a characteristic as described above in reference to FIGS. 1A-9. Characteristic may be a characteristic not depicted in the at least an image. As a non-limiting example, characteristic may include a geometric feature absent from at least an image, such as a projection, recess, flange, surface feature, or distortion of object depicted in the at least an image. Characteristic may include a surface texture of object not depicted in at least an image. Characteristic may include a color not depicted in the at least an image. Characteristic may include a material component not depicted in the at least an image.

At step 1225, and with continued reference to FIG. 12, at least a three-dimensional graphical model of object is generated. In an embodiment, at least a mathematical description 804 of the object is automatically generated as a function of the at least an image via the computing device. At least a mathematical description 804 may be any at least a mathematical description 804 as described above in reference to FIGS. 1A-9. Where at least an image includes a three-dimensional graphical model, generating at least a mathematical description 804 may include extracting at least a three-dimensional geometric form making up a component of the three-dimensional graphical model. This may be performed by an interrogator operating in system 100, including without limitation CAD model analyzer 114; identification and extraction of component geometries of a three-dimensional model may be performed according to any method for identification and extraction or reproduction of geometries by any interrogator, interrogator engine, or the like described above or in material incorporated herein by reference. Component of three-dimensional graphical form may include the geometric form of any portion of three-dimensional graphical form and/or of the entire three-dimensional graphical form. Interrogator may generate a mathematical description of the at least a three-dimensional geometric form; for instance, interrogator may determine a formula for an edge, curve, or surface of the three-dimensional geometric form, a location of a vertex, edge, or other point in a coordinate system to be used by modeling program or modeling programs, or any other factors necessary to render the three-dimensional geometric form in modeling program or modeling programs. In an embodiment, at least a three-dimensional geometric form includes a plurality of three-dimensional geometric forms; interrogator may garage a mathematical description for each three-dimensional geometric form of the plurality of three-dimensional geometric forms. Interrogator may generate one or more rules for combining the plurality of three-dimensional geometric forms to form a model of object; rules for combining the three-dimensional geometric forms may include at least a parametric descriptor, a reference to at least a characteristic descriptor 812, or the like.

Continuing to refer to FIG. 12, where at least an image includes at least a two-dimensional image, generating may include identification by interrogator of at least a first two-dimensional geometric form in a first image of the at least a two-dimensional image. At least a first two-dimensional geometric form may by identified by comparison of one or more features of at least a two-dimensional image to one or more geometric primitive forms, as illustrated and described in further detail below. Interrogator may match the at least a first two-dimensional geometric form to at least a first three-dimensional form; the at least a first two-dimensional geometric form may represent a two-dimensional projection of the at least a first three-dimensional form.

Referring now to FIGS. 13A-D, an exemplary sequence of steps is illustrated for the purposes of discussion. At least a two-dimensional image 1300 may include a depiction of object in a two-dimensional form 1304; object may be a geometric primitive, such as without limitation a cylinder, or a combination of geometric primitives of one or more types to form a more complex form. Where object is a three-dimensional object, form 1304 may represent a two-dimensional projection of the object. As a non-limiting example where object is a cylinder, form 1304 may be some projection of a cylinder, which may include some combination of circles or ellipses and/or straight lines. Interrogator may identify one or more geometric components 1308 of form 1304; this may be performed using the same functionality use for identification of geometric forms in a three-dimensional file. In an embodiment two-dimensional image may be transformed into a computer model, such as a CAD model, incorporating two-dimensional form as a single face or planar structure 1312, which interrogator may then interrogate. As a non-limiting example, and for the purposes of illustration only, interrogator may extract from a two-dimensional projection of a cylinder two ellipses and a quadrilateral form such as a trapezoid. Interrogator may identify faces or cross-sectional forms of a three-dimensional figure using functionality that computer modeling programs such as CAD modules 106 and/or 108*a-n*; as a non-limiting example, interrogator may identify a rectangular as one possible cross-sectional form or face that appears in a projection as a trapezoid, and a circle as a possible projection of an ellipse. Alternatively or additionally, interrogator may refer to a reverse-projection database as described in further detail below. Matched projections, including faces and/or cross-sectional forms, may then be assembled using a computer modeling program, such as CAD modules 106 and/or 108*a-n*, to generate a three-dimensional model 1316.

Referring now to FIG. 14, an exemplary embodiment of a reverse projection database 1400 is illustrated. Reverse projection database 1400 may relate at least an object model descriptor to one or more projections 1404; one or more projections 1404 may be two-dimensional views of object model, including views of faces, cross-sections, and/or perspective projections. One or more projections 1404 may be automatedly generated using a computer modeling program such as CAD module 106 and/or 108*a-n*. Generation of one or more projections 1404 may be performed upon the creation of a new object model descriptor, for instance as set forth below. In an embodiment, a query may return an object model associated with one or more projections 1404. As a non-limiting example, matching the at least a first two-dimensional image may include generating a mathematical description of the at least a first two-dimensional image; mathematical description may be any mathematical description as described above in reference to FIGS. 1A-9. Matching the at least a first two-dimensional image may include querying reverse projection database 1400 linking a plurality of object model descriptors 800 of three-dimensional objects to mathematical descriptions 1404 of two-dimensional objects using the mathematical description. The result set of the query may include at least a three-dimensional object as described by at least an object model descriptor 800.

Referring again to FIG. 12, at least a three-dimensional geometric form may include a plurality of three-dimensional geometric forms. A two-dimensional image may represent a two-dimensional projection of more than one possible three-dimensional image; for instance, what appears from a first view to be a cylinder may have conflicting or additional features on a side that in the two-dimensional image is occluded. A cup, for instance, may be purely cylindrical as seen from one side, while from another side may include a handle or other projection, or a flat portion. In an embodiment, interrogator may generate more than one three-dimensional form of which at least a first two-dimensional geometric form is a projection. Where matching at least a first two-dimensional geometric form to a three-dimensional geometric form is performed by interrogation of a reverse projection database, a plurality of three-dimensional geometric forms in the database may match at least a first two-dimensional form, and that plurality may be returned. In some embodiments, plurality of three-dimensional geometric forms may be filtered by presentation to the user of a plurality of three-dimensional models as described below.

Still referring to FIG. 12, interrogator may filter plurality of three-dimensional graphical forms by reference to a second two-dimensional image of the at least an image. Interrogator may extract at least a second two-dimensional form from second two-dimensional image and match with at least a second three-dimensional form; this may be performed as described above for matching at least a first two-dimensional form to at least a first three-dimensional form. Interrogator may then compare at least a first three-dimensional form to at least a second three-dimensional form. Interrogator may alternatively or additionally generate one or more two-dimensional projections of first three-dimensional form and compare the one or more two-dimensional projections to at least a second two-dimensional form. Interrogator may alternatively or additionally compute one or more dimensional measurements of at least a second two-dimensional form and compare the one or more dimensional measurements to dimensional measurements of the at least a first three-dimensional form. In some embodiment, Interrogator eliminates forms of at least a three-dimensional form that conflict with second two-dimensional image based on the above comparisons. Alternatively or additionally, interrogator may combine at least a second three-dimensional form and at least a first three-dimensional form to produce a modified at least a first three-dimensional form. This may be performed by an analysis of differing geometries by interrogator; for instance, where first three-dimensional form includes a cylinder and at least a second three-dimensional form includes a cylinder with a mug handle, interrogator may modify first three-dimensional form to include the mug handle.

Continuing to refer to FIG. 12, interrogator may generate at least a three-dimensional graphical model of object as a function of the at least a three-dimensional form. Where at least a three-dimensional form includes a single form that represents the entirety of object, interrogator may create a three-dimensional graphical model based solely or principally on at least a three-dimensional form. Where at least a three-dimensional form includes a plurality of three-dimensional forms representing different parts of object, interrogator may generate at least a three-dimensional graphical model of object by combining the plurality of three-dimensional forms. Interrogator may generate a plurality of three-dimensional graphical models of object; for instance, where a given component of object may be represented by more than one three-dimensional form, interrogator may create a three-dimensional graphical model representing each possible combination of three-dimensional graphical forms. Interrogator may filter the plurality of possible combinations; for instance, interrogator may discard combinations of models that are determined to be incompatible, for instance using compatibility testing as described in materials incorporated herein by reference. Interrogator may filter the plurality of three-dimensional graphical forms. In an embodiment, interrogator may identify at least a second two-dimensional geometric form in at least a second image; this may be performed as described above. Interrogator may compare each three-dimensional graphical model of plurality of three-dimensional graphical models to at least a second two-dimensional geometric form, using any method or means described above for comparing at least a first three-dimensional form to at least a second two-dimensional geometric form or to a three-dimensional graphical form generated therefrom. As a non-limiting example, for each three-dimensional graphical form of the plurality of three-dimensional graphical forms, interrogator may generate at least a two-dimensional projection of at least a three-dimensional form from which the three-dimensional graphical model was generated and compare the at least a two-dimensional projection to the at least a second two-dimensional geometric form.

With continued reference to FIG. 12, at least a three-dimensional graphical model of object may be displayed to the user. Where there is a plurality of three-dimensional graphical models of object, system 100 may display the plurality of three-dimensional graphical models to the user. Plurality of three-dimensional graphical models may be ranked; ranking may be performed similarly to ranking as described above in reference to FIG. 9. In an embodiment, filtering of plurality of graphical models may be performed using user feedback. As a non-limiting example, each three-dimensional graphical model of the plurality of three-dimensional graphical models may be displayed to the user; a user input may be received indicating whether the three-dimensional graphical model matches the object. User may select one or more three-dimensional graphical models, using a check-box or similar selection facility, to indicate that the one or more three-dimensional graphical models match the object. User may select one or more three-dimensional graphical models, using a check-box or similar selection facility, to indicate that the one or more three-dimensional graphical models do not match the object. In an embodiment, subsequent steps of method 1200 are performed with three-dimensional graphical models user has indicated are matches.

At step 1230, and still viewing FIG. 12, at least a three-dimensional graphical model of the object is modified using the at least a characteristic descriptor 812; this may be performed as described above in reference to FIG. 9. At least a three-dimensional graphical model of the object as modified may be displayed to the user. In an embodiment, at least a three-dimensional graphical model of the object as modified may include a plurality of such models, and user may select one or more such models. System 100 may store selected model in model descriptor database 148 according to methods described herein; system 100 may prompt and/or receive from user one or more words to associated with selected model. System 100 may initiate manufacture of selected model.

In embodiments of method 1200, a user can take advantage of the language-processing, artificial intelligence, and image processing capabilities of system 100 to create a model or object based on existing object or image thereof the user has encountered; for instance, user may see an object such as a machine part, an item of flatware, or any other item that may be manufactured, take one or more photographs of the object, or scan the object in a three-dimensional scanner such as a CT scanner, then verbally or textually describe modifications thereto that produce a new object the user wishes to produce. Similarly, a user can utilize an image taken from the Internet or the like as a starting point for a creative process whereby user commands submitted in textual or verbal form shape the object depicted to match the user's own vision. Any step or steps of method 1200 may be repeated, omitted, and/or combined with any step or sets of steps of any other method described or alluded to herein, including without limitation use of method 1200 or steps of method 1200 to further modify models generated in methods 900 and/or 1100 and/or models retrieved from or added to model descriptor database 148 for instance and without limitation as described below regarding method 1500.

Figure 15:
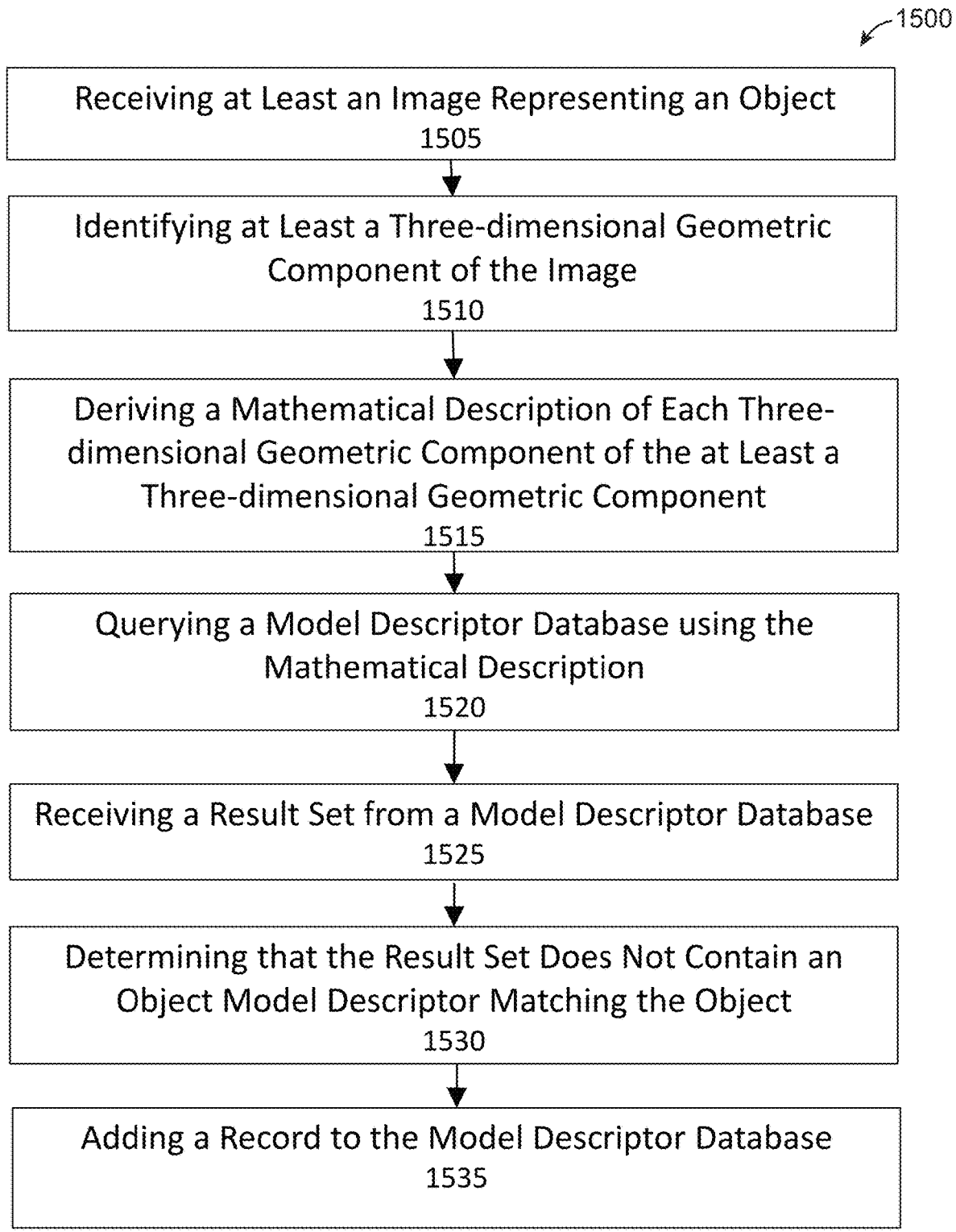
FIG. 15 represents an exemplary method of populating a model descriptor database in an embodiment.

Referring now to FIG. 15, an exemplary embodiment of a method 1500 of populating a model descriptor database operating on a computing device is illustrated. At step 1505, at least an image representing an object is automatedly received via a computing device; this may be implemented as described above in reference to FIG. 12. At least an image may include a three-dimensional image of object; alternatively or additionally, at least an image may include at least a two-dimensional image of object. At step 1510, at least a three-dimensional geometric component of the image is identified by an interrogator engine operating on the computing device. Interrogator engine may be any interrogator engine as described above. Where at least an image includes a three-dimensional image, interrogator engine may extract at least a three-dimensional geometric form as described above. Where at least an image includes a two dimensional image, interrogator engine may match at least a three-dimensional graphical form to at least a two-dimensional graphical form extracted from the two-dimensional image, as described above, and identify the matching at least a three-dimensional form as at least a three-dimensional component of image. At least a three-dimensional geometric component as used herein may include a geometric representation of entire image, or a geometric representation of a portion of image.

At step 1515, and still viewing FIG. 15, interrogator engine derives a mathematical description of each three-dimensional geometric component of the at least a three-dimensional geometric component of the image; this may be implemented as described above in reference to FIG. 12. At step 1520, model descriptor database 148 is queried using the mathematical description; model descriptor database 148 may be a model descriptor database as described above. A query may be assembled using one or more mathematical descriptions; as a non-limiting example, where one or more mathematical descriptions are stored as a binary or text description, this may be performed using a textual search. Query may be formed and/or searched for using any suitable method or means for querying a data store for data elements. At step 1525, a result set is received from model descriptor database 148. Result set may be null. Result set may have one or more results, representing object model descriptors; object model descriptors may include exact or partial matches to a three-dimensional geometric component of at least a three-dimensional geometric component.

At step 1530, and still viewing FIG. 15, it is determined that the result set does not contain an object model descriptor matching object. As a non-limiting example, result set may include object model descriptors that collectively contain all three-dimensional geometric components but do not include an object model descriptor having a parametric descriptor furnishing one or more rules for combining three-dimensional geometric components to form a model of object; as another example, result set may contain a set of object model descriptors, and the set may lack any object model descriptor containing at least one three-dimensional geometric component of at least a three-dimensional geometric component. Result set may be null.

At step 1535, and with continued reference to FIG. 15, a record is added to the model descriptor database 148. Record includes an object model descriptor containing a reference to each three-dimensional geometric component of at least a three-dimensional geometric component and a parametric descriptor describing a rule for combining each three-dimensional geometric component of the at least a three-dimensional geometric component to form a model of object. Where at least one of the at least a three-dimensional geometric component was not contained in the result set, at least a mathematical description 804 describing the at least a three-dimensional geometric component may be included in object model descriptor. At least a word associated with object model descriptor may be added to model descriptor database 148 and associated with object model descriptor in model descriptor database 148; in an embodiment, at least a word may be received from a user. As a result, at least a word may later be useable to retrieve object model descriptor from model descriptor database 148. Where method 1500 or steps thereof are used to store object models in model descriptor database 148 as generated during methods 900, 1100, and/or 1200, or performance of any steps thereof, words from user verbal or textual inputs received in the course of such methods may be used to generate at least a word.

In an embodiment, method 1500 permits system 100 to create and augment an expanding vocabulary of symbols, linked to language utilized by users, to permit user verbal commands to be used in creating and/or modifying graphical models. Any step or steps of method 1500 may be repeated, omitted, and/or combined with any step or sets of steps of any other method described or alluded to herein, including without limitation use of method 1500 or steps of method 1500 to store models generated or received at any stage of methods 900, 1100, and/or 1200 in model descriptor database 148.

It is to be noted that any one or more of the aspects and embodiments described herein may be conveniently implemented using one or more machines (e.g., one or more computing devices that are utilized as a user computing device for an electronic document, one or more server devices, such as a document server) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk (e.g., a conventional floppy disk, a hard drive disk), an optical disk (e.g., a compact disk "CD", such as a readable, writeable, and/or re-writable CD; a digital video disk "DVD", such as a readable, writeable, and/or rewritable DVD), a magneto-optical disk, a read-only memory "ROM" device, a random access memory "RAM" device, a magnetic card, an optical card, a solid-state memory device (e.g., a flash memory), an EPROM, an EEPROM, and any combinations thereof. A machine-readable medium, as used herein, is intended to include a single medium as well as a collection of physically separate media, such as, for example, a collection of compact disks or one or more hard disk drives in combination with a computer memory. As used herein, a machine-readable storage medium does not include a signal.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a personal digital assistant "PDA", a mobile telephone, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 16:
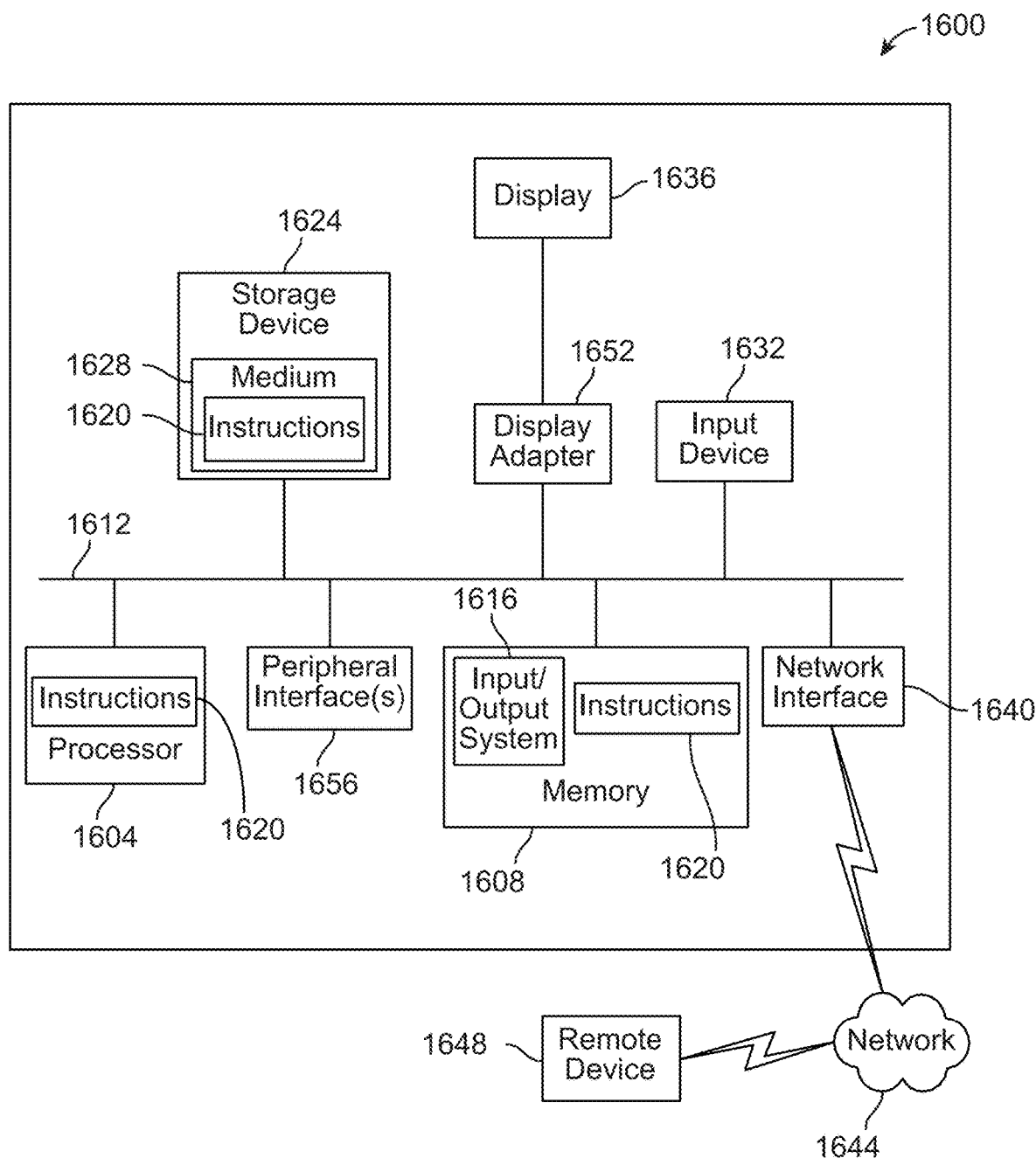
FIG. 16 is a block diagram schematically illustrating exemplary hardware implementations of embodiments of the present invention.

FIG. 16 shows a diagrammatic representation of one embodiment of a computing device in the exemplary form of a computer system or computing module 1600 within which a set of instructions for causing a control system, for example, system 100, sub-system 102 or CAD program module 106, to perform any one or more of the aspects and/or methodologies of the present disclosure may be executed. It is also contemplated that multiple computing devices may be utilized to implement a specially configured set of instructions for causing the device to perform any one or more of the aspects and/or methodologies of the present disclosure. Computer system or module 1600 includes a processor 1604 and a memory 1608 that communicate with each other, and with other components, via a bus 1612. Bus 1612 may include any of several types of bus structures including, but not limited to, a memory bus, a memory controller, a peripheral bus, a local bus, and any combinations thereof, using any of a variety of bus architectures.

Memory 1608 may include various components (e.g., machine readable media) including, but not limited to, a random access memory component (e.g., a static RAM "SRAM", a dynamic RAM "DRAM", etc.), a read only component, and any combinations thereof. In one example, a basic input/output system 1616 (BIOS), including basic routines that help to transfer information between elements within computer system 1600, such as during start-up, may be stored in memory 1608. Memory 1608 may also include (e.g., stored on one or more machine-readable media) instructions (e.g., software) 1620 embodying any one or more of the aspects and/or methodologies of the present disclosure. In another example, memory 1608 may further include any number of program modules including, but not limited to, an operating system, one or more application programs, other program modules, program data, and any combinations thereof.

Computer system 1600 may also include a storage device 1624. Examples of a storage device (e.g., storage device 1624) include, but are not limited to, a hard disk drive for reading from and/or writing to a hard disk, a magnetic disk drive for reading from and/or writing to a removable magnetic disk, an optical disk drive for reading from and/or writing to an optical medium (e.g., a CD, a DVD, etc.), a solid-state memory device, and any combinations thereof. Storage device 1624 may be connected to bus 1612 by an appropriate interface (not shown). Example interfaces include, but are not limited to, SCSI, advanced technology attachment (ATA), serial ATA, universal serial bus (USB), IEEE 1244 (FIREWIRE), and any combinations thereof. In one example, storage device 1624 (or one or more components thereof) may be removably interfaced with computer system 1600 (e.g., via an external port connector (not shown)). Particularly, storage device 1624 and an associated machine-readable medium 1628 may provide nonvolatile and/or volatile storage of machine-readable instructions, data structures, program modules, and/or other data for computer system 1600. In one example, software 1620 may reside, completely or partially, within machine-readable medium 1628. In another example, software 1620 may reside, completely or partially, within processor 1604.

Computer system 1600 may also include an input device 1632. In one example, a user of computer system 1600 may enter commands and/or other information into computer system 1600 via input device 1632. Examples of an input device 1632 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), touchscreen, and any combinations thereof. Input device 1632 may be interfaced to bus 1612 via any of a variety of interfaces (not shown) including, but not limited to, a serial interface, a parallel interface, a game port, a USB interface, a FIREWIRE interface, a direct interface to bus 1612, and any combinations thereof. Input device 1632 may include a touch screen interface that may be a part of or separate from display 1636, discussed further below. Input device 1632 may be utilized as a user selection device for selecting one or more graphical representations in a graphical interface as described above.

A user may also input commands and/or other information to computer system 1600 via storage device 1624 (e.g., a removable disk drive, a flash drive, etc.) and/or network interface device 1640. A network interface device, such as network interface device 1640 may be utilized for connecting computer system 1600 to one or more of a variety of networks, such as network 1644, and one or more remote devices 1648 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 1644, may employ a wired and/or a wireless mode of communication. In general, any network topology may be used. Information (e.g., data, software 1620, etc.) may be communicated to and/or from computer system 1600 via network interface device 1640.

Computer system 1600 may further include a video display adapter 1652 for communicating a displayable image to a display device, such as display device 1636. Examples of a display device include, but are not limited to, a liquid crystal display (LCD), a cathode ray tube (CRT), a plasma display, a light emitting diode (LED) display, and any combinations thereof. Display adapter 1652 and display device 1636 may be utilized in combination with processor 1604 to provide graphical representations of aspects of the present disclosure. In addition to a display device, a computer system 1600 may include one or more other peripheral output devices including, but not limited to, an audio speaker, a printer, and any combinations thereof. Such peripheral output devices may be connected to bus 1612 via a peripheral interface 1656. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. Additionally, although the methods herein have been illustrated as being performed in a specific order, the ordering is highly variable within ordinary skill to achieve the methods, systems, and software for hardware-component based geometric modifications of computer-modeled part designs described herein. Accordingly, this description is meant to be taken only by way of example, and not to otherwise limit the scope of this invention.

What is claimed is:

1. A method for providing a natural language interface for a computer-aided design (CAD) system, the method performed by a computing device and comprising:
    automatedly receiving, via the computing device, a user voice input comprising a plurality of words;
    automatedly, via the computing device, parsing the user voice input;
    automatedly, via the computing device, determining a meaning for the parsed user voice input, the meaning including one or more words associated with an object and one or more words associated with a characteristic of the object;
    automatedly, via the computing device, retrieving from interrogating a CAD model at least an object model descriptor and at least a characteristic descriptor, using the determined meaning,
        wherein the object model descriptor comprises:
            at least a mathematical description of a three-dimensional object form of the object; and
            at least a first parametric instruction for manufacturing the object using the three-dimensional object form;
        and wherein the at least a characteristic descriptor refers to a second graphical model and the at least a characteristic descriptor comprises a modification to the mathematical description of the graphical model of the object;
    automatedly, via the computing device, generating at least a graphical model of the object using the at least an object model descriptor;
    determining, via the computing device, a mismatch between the at least a graphical model of the object and the second graphical model based upon a fit between the at least a graphical model of the object and the second graphical model;
    automatedly, via the computing device, prompting the user for missing information determined as a function of the determination of the mismatch between the at least a graphical model of the object and the second graphical model being below a predetermined threshold;
    automatedly, via the computing device, generating at least a modified graphical model of the object,
        wherein generating the at least a modified graphical model of the object comprises:
            modifying the at least a graphical model of the object, as a function of prompting the user for the missing information, based upon the fit between the at least a graphical model of the object and the second graphical model and the characteristic descriptor, the modifying the graphical model of the object further comprising modifying the graphical model of the object as a function of the modification to the mathematical description; and
            including the second object model into the modified graphical model of the object as function of the characteristic descriptor by adding at least a part of the second graphical model to a particular location of the first graphical model.

2. The method of claim 1, wherein generating the object model further comprises retrieving, from the model descriptor database, at least a graphical model associated with the object model descriptor.

3. The method of claim 2, wherein generating the object model further comprises:
    retrieving, from the model descriptor database, at least a modification to the at least a graphical model associated with the object model descriptor, the at least a modification associated with the object model descriptor; and
    modifying the at least a graphical model using the at least a modification.

4. The method of claim 1, wherein the at least an object model descriptor includes a plurality of object model descriptors, and wherein generating the at least a graphical model of the object further comprises generating a plurality of graphical models of the object, each of the plurality of graphical models of the object generated using an object model descriptor of the plurality of object model descriptors.

5. The method of claim 4, wherein modifying the at least a graphical model of the object further comprises modifying each of the plurality of graphical models as a function of the at least a characteristic descriptor.

6. The method of claim 4, further comprising ranking the plurality of graphical objects of the model according to relevance to a query.

7. The method of claim 1, wherein the at least a characteristic descriptor includes a plurality of characteristic descriptors, and wherein modifying the at least a graphical model of the object further comprises generating a plurality of modified graphical models, the plurality of modified graphical models including a modified graphical model representing the object modified using each characteristic descriptor of the plurality of characteristic descriptors.

8. The method of claim 1, wherein the characteristic descriptor further comprises a descriptor associated with at least a geometrical model, and wherein modifying the graphical model of the object using the at least a characteristic descriptor further comprises adding the at least a geometric model to the graphical model of the object.

9. The method of claim 8, wherein the characteristic descriptor further comprises:
    at least a mathematical description of a three-dimensional characteristic form represented in the geometric model; and
    at least a second parametric instruction for manufacturing the characteristic using the three-dimensional characteristic form.

10. The method of claim 8, wherein determining the meaning further comprises determining one or more words associated with a specific location on the object, and wherein adding the at least a geometrical model to the graphical model of the object further comprises:
    identifying, in the graphical model of the object, a representation of the specific location; and adding the at least a geometric model at the representation of the specific location.

11. The method of claim 1, further comprising modifying the second graphical model to be compatible with the at least a graphical model of the object.

12. The method of claim 1 further comprising modifying the at least a graphical model of the object to be compatible with the second graphical model.

13. The method of claim 1 further comprising excluding a combination of at least a part of the second graphical model and the at least a graphical model of the object from the at least a modified graphical model of the object.

14. The method of claim 1 further comprising automatedly, via the computing device, and based on the determined meaning, identifying additional information describing the object in a CAD context database, and wherein retrieving the at least an object model descriptor further comprises retrieving at the at least an object model descriptor using the additional information.

15. The method of claim 1, wherein retrieving the object model descriptor further comprises:

automatedly, via the computing device, assembling a query for additional information based on the determined meaning;

automatedly, via the computing device, providing the assembled query to a resource provider service;

automatedly, via the computing device, receiving the additional information from the resource provider service, the additional information comprising information regarding the object; and retrieving the object model descriptor using the additional information.

16. The method of claim 1 further comprising displaying the modified graphical model of the object to a user.

17. The method of claim 1, wherein the at least a modified graphical model of the object includes a plurality of modified graphical models, and further comprising receiving, from the user, a selection of a modified graphical model from the plurality of modified graphical models.

18. The method of claim 1 further comprising initiating manufacture of the object using the modified graphical model of the object.

* * * * *